US012027564B2

(12) United States Patent
Ushikura et al.

(10) Patent No.: US 12,027,564 B2
(45) Date of Patent: Jul. 2, 2024

(54) METHOD OF MANUFACTURING RADIOGRAPHIC IMAGING APPARATUS, AND TRANSPORT JIG

(71) Applicant: FUJIFILM CORPORATION, Tokyo (JP)

(72) Inventors: Shinichi Ushikura, Kanagawa (JP); Hisao Fujiwara, Kanagawa (JP); Tatsunori Tanimoto, Kanagawa (JP); Keiichi Akamatsu, Kanagawa (JP)

(73) Assignee: FUJIFILM CORPORATION, Tokyo (JP)

( * ) Notice: Subject to any disclaimer, the term of this patent is extended or adjusted under 35 U.S.C. 154(b) by 273 days.

(21) Appl. No.: 17/480,158

(22) Filed: Sep. 21, 2021

(65) Prior Publication Data

US 2022/0102399 A1   Mar. 31, 2022

(30) Foreign Application Priority Data

Sep. 25, 2020   (JP) .................................. 2020-161416

(51) Int. Cl.
*H01L 31/18*   (2006.01)
*H01L 27/146*   (2006.01)

(52) U.S. Cl.
CPC .... *H01L 27/1469* (2013.01); *H01L 27/14663* (2013.01); *H01L 31/1896* (2013.01)

(58) Field of Classification Search
CPC .................................................. H01L 31/1896
See application file for complete search history.

(56) References Cited

U.S. PATENT DOCUMENTS

2016/0172414 A1 * 6/2016 Saruta ............... H01L 27/14618
                                                    250/361 R
2018/0313962 A1 * 11/2018 Ushikura ................ G01T 1/246

FOREIGN PATENT DOCUMENTS

WO    2018/173894 A1    9/2018

* cited by examiner

*Primary Examiner* — David P Porta
*Assistant Examiner* — Shun Lee
(74) *Attorney, Agent, or Firm* — SOLARIS Intellectual Property Group, PLLC

(57) ABSTRACT

A method of manufacturing a radiographic imaging apparatus, including: providing a flexible base material on a support body and forming a substrate in which pixels are provided in a pixel region of a first surface of the base material; providing a terminal portion for connecting a cable on the first surface; connecting a circuit board for reading the electric charges from the pixels or driving the pixels to the terminal portion via the cable; peeling the substrate from the support body; and using a transport jig including a suction unit having suction members and a holding part having a holding member, to suction and support the first surface or a second surface opposite to the first surface with the suction members, and transporting the substrate peeled from the support body in a state where the circuit board is held by the holding member.

10 Claims, 12 Drawing Sheets

METHOD OF MANUFACTURING RADIOGRAPHIC IMAGING APPARATUS, AND TRANSPORT JIG

CROSS-REFERENCE TO RELATED APPLICATION

The present application claims priority under 35 U.S.C. § 119 to Japanese Patent Application No. 2020-161416, filed on Sep. 25, 2020. The above application is hereby expressly incorporated by reference, in its entirety, into the present application.

BACKGROUND

Technical Field

The present disclosure relates to a method of manufacturing a radiographic imaging apparatus, and a transport jig.

Description of the Related Art

In the related art, radiographic imaging apparatuses that perform radiographic imaging for medical diagnosis have been known. A radiation detector for detecting radiation transmitted through a subject and generating a radiographic image is used for such radiographic imaging apparatuses.

As the radiation detector, there is one comprising a conversion layer, such as a scintillator, which converts radiation into light, and a substrate in which a plurality of pixels, which accumulate electric charges generated depending on light converted in the conversion layer, are provided. As the base material of a sensor substrate of such a radiation detector, one formed of a flexible base material is known. Additionally, by using the flexible base material, there is a case where the weight of the radiographic imaging apparatuses can be reduced and imaging of the subject becomes easy.

WO2018/173894A describes a method of manufacturing a radiation detector provided with a sensor substrate formed of a flexible base material. The manufacturing method described in WO2018/173894A includes a step of providing the flexible base material on a support body to form a substrate and then peeling the substrate from the support body.

In the technique described in WO2018/173894A, a step of transporting the substrate peeled from the support body is required. However, since the base material has flexibility and the base material is deflected during transport, there is a case where it is difficult to transport the substrate in a stable state. Additionally, in a case where the substrate in a state where the circuit board is electrically connected is transported, there is a case where it is difficult to transport the substrate formed of the flexible base material and the circuit board in a stable state because both are separate bodies.

An object of the present disclosure is to provide a method of manufacturing a radiographic imaging apparatus capable of transporting each of a substrate formed of a flexible base material and a circuit board in a stable state, and a transport jig.

SUMMARY

In order to achieve the above object, a method of manufacturing a radiographic imaging apparatus according to a first aspect of the present disclosure comprises providing a flexible base material on a support body and forming a substrate in which a plurality of pixels that accumulate electric charges generated in response to light converted from radiation are provided in a pixel region of a first surface of the base material; providing a terminal portion for electrically connecting a cable on the first surface of the base material; electrically connecting a circuit board for reading the electric charges from the pixels or driving the pixels to the terminal portion via the cable; peeling the substrate in which the terminal portion is electrically connected to the circuit board via the cable from the support body; and using a transport jig including a suction unit having a plurality of suction members and a holding part having a holding member, to suction and support the first surface of the base material or a second surface opposite to the first surface with the plurality of suction members, and transporting the substrate peeled from the support body in a state where the circuit board is held by the holding member.

Additionally, the method of manufacturing the radiographic imaging apparatus according to a second aspect of the present disclosure based on the method of manufacturing the radiographic imaging apparatus according to the first aspect further comprises forming a conversion layer that converts the radiation into light, on the first surface of the base material, and in transporting the substrate with the transport jig, the substrate provided with the conversion layer is transported by the transport jig.

Additionally, the method of manufacturing the radiographic imaging apparatus according to a third aspect of the present disclosure based on the method of manufacturing the radiographic imaging apparatus according to the first aspect further comprises forming a conversion layer that converts the radiation into light, on the first surface of the base material after the substrate is transported by the transport jig.

Additionally, the method of manufacturing the radiographic imaging apparatus according to a fourth aspect of the present disclosure based on the method of manufacturing the radiographic imaging apparatus according to the first aspect further comprises providing a reinforcing member for reinforcing a strength of the base material on the second surface of the base material.

Additionally, the method of manufacturing the radiographic imaging apparatus according to a fifth aspect of the present disclosure based on the method of manufacturing the radiographic imaging apparatus according to the first aspect the holding member of the transport jig holds the circuit board by placing the circuit board in a state where the cable is folded.

Additionally, the method of manufacturing the radiographic imaging apparatus according to a sixth aspect of the present disclosure based on the method of manufacturing the radiographic imaging apparatus according to the first aspect the holding member of the transport jig holds the circuit board by placing the circuit board in a state where the cable is extended.

Additionally, the method of manufacturing the radiographic imaging apparatus according to a seventh aspect of the present disclosure based on the method of manufacturing the radiographic imaging apparatus according to the first aspect the circuit board is provided with a hole, the holding member of the transport jig is provided with a pin, and the transport jig holds the circuit board by inserting the pin into the hole of the circuit board.

Additionally, the method of manufacturing the radiographic imaging apparatus according to an eighth aspect of the present disclosure based on the method of manufacturing the radiographic imaging apparatus according to the first aspect the holding member of the transport jig holds the circuit board by suction.

Additionally, the method of manufacturing the radiographic imaging apparatus according to a ninth aspect of the present disclosure based on the method of manufacturing the radiographic imaging apparatus according to the first aspect the transport jig supports an entire surface of the second surface of the base material with the plurality of suction members.

Additionally, the method of manufacturing the radiographic imaging apparatus according to a tenth aspect of the present disclosure based on the method of manufacturing the radiographic imaging apparatus according to the first aspect each of the plurality of suction members of the transport jig is provided with a buffer member that absorbs unevenness of the base material.

Additionally, a transport jig of an eleventh aspect of the present disclosure is a transport jig for transporting a substrate in which a pixel region of a first surface of a flexible base material is provided with a plurality of pixels for accumulating electric charges generated in response to light converted from radiation and which is provided with a terminal portion to which a circuit board for reading the electric charges from the pixels or for driving the pixels is electrically connected via a cable. The transport jig comprises a suction unit having a plurality of suction members for suctioning the first surface of the base material or a second surface opposite to the first surface; and a holding part having a holding member that holds the circuit board.

Additionally, in the transport jig of a twelfth aspect of the present disclosure based on the transport jig of the eleventh aspect, each of the plurality of suction members is provided with a buffer member that absorbs unevenness of the base material.

According to the present disclosure, a substrate formed of a flexible base material and a circuit board can be transported in a stable state.

BRIEF DESCRIPTION OF THE DRAWINGS

Exemplary embodiments according to the technique of the present disclosure will be described in detail based on the following figures, wherein.

DETAILED DESCRIPTION

Hereinafter, embodiments of the present invention will be described in detail with reference to the drawings. In addition, the present embodiments do not limit the present invention.

First, a radiation detector and a radiographic imaging apparatus of the present embodiment will be described. The radiation detector of the present embodiment has a function of detecting radiation transmitted through a subject to output image information representing a radiographic image of the subject. The radiation detector of the present embodiment comprises a sensor substrate and a conversion layer that converts radiation into light (refer to a sensor substrate 12 and a conversion layer 14 of the radiation detector 10 in FIG. 3). The sensor substrate 12 of the present embodiment is an example of a substrate of the present disclosure.

Figure 1:
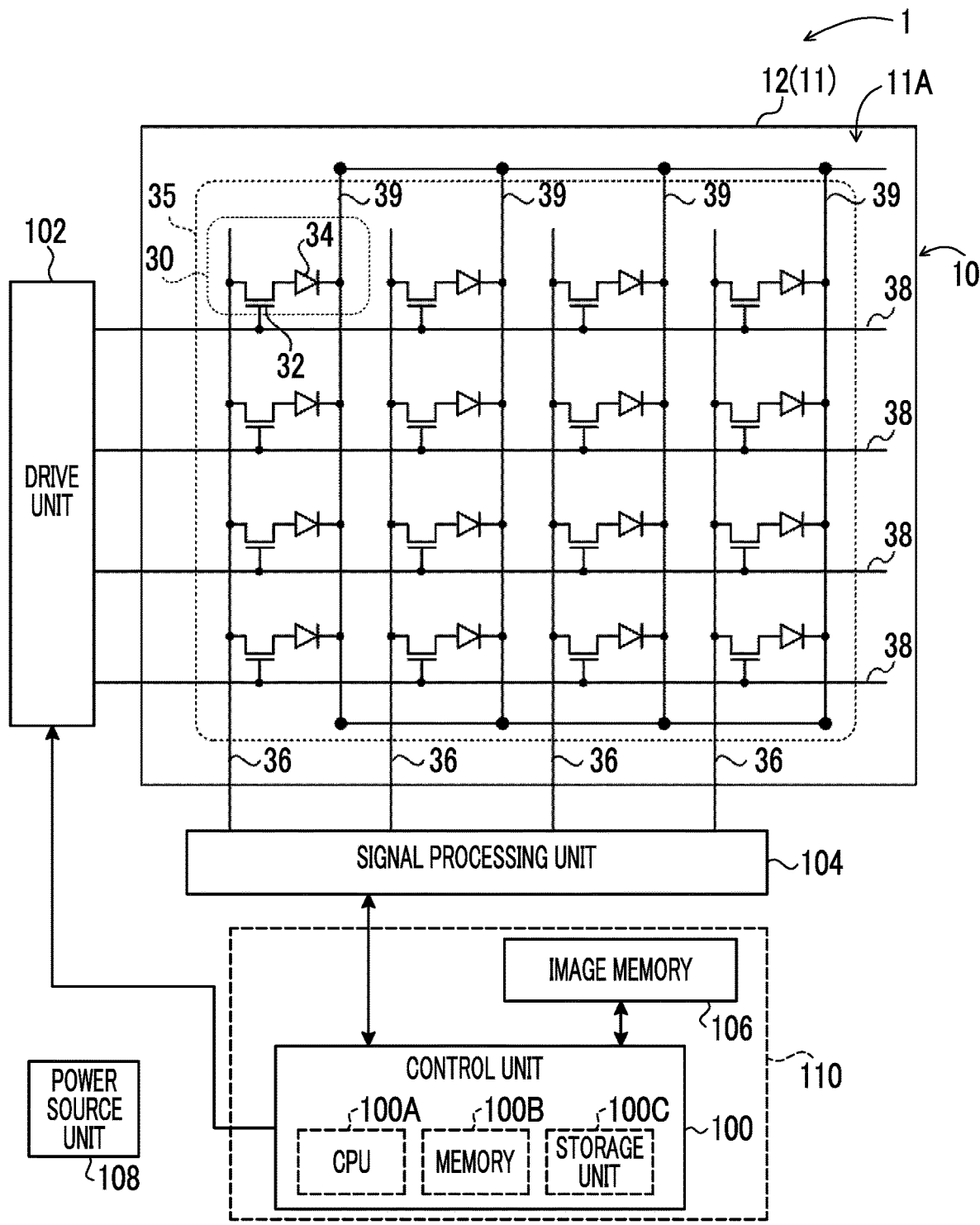
FIG. 1 is a block diagram showing an example of the configuration of main parts of an electrical system in a radiographic imaging apparatus of an embodiment.

First, the outline of an example of the configuration of an electrical system in the radiographic imaging apparatus of the present embodiment will be described with reference to FIG. 1. FIG. 1 is a block diagram showing an example of the configuration of main parts of the electrical system in the radiographic imaging apparatus of the present embodiment.

As shown in FIG. 1, the radiographic imaging apparatus 1 of the present embodiment comprises the radiation detector 10, a control unit 100, a drive unit 102, a signal processing unit 104, an image memory 106, and a power source unit 108. At least one of the control unit 100, the drive unit 102, or the signal processing unit 104 of the present embodiment is an example of a circuit unit substrate of the present disclosure. Hereinafter, the control unit 100, the drive unit 102, and the signal processing unit 104 are collectively referred to as the "circuit board".

The radiation detector 10 comprises the sensor substrate 12 and a conversion layer 14 (refer to FIG. 3) that converts radiation into light. The sensor substrate 12 comprises a flexible base material 11, and a plurality of pixels 30 provided on a first surface 11A of the base material 11. In addition, in the following description, the plurality of pixels 30 may be simply referred to as "pixels 30".

As shown in FIG. 1, each pixel 30 of the present embodiment comprises a sensor unit 34 that generates and accumulates electric charges in response to the light converted by the conversion layer, and a switching element 32 that reads out the electric charges accumulated in the sensor unit 34. In the present embodiment, as an example, a thin film transistor (TFT) is used as the switching element 32. For that reason, in the following description, the switching element 32 is referred to as a "TFT 32". In the present embodiment, a layer in which the pixels 30 are formed on the first surface 11A of the base material 11 is provided as a layer that is formed with the sensor unit 34 and the TFT 32 and is planarized.

The pixels 30 are two-dimensionally arranged in one direction (a scanning wiring direction corresponding to a transverse direction of FIG. 1, hereinafter referred to as a "row direction"), and a direction intersecting the row direction (a signal wiring direction corresponding to the machine direction of FIG. 1, hereinafter referred as a "column direction") in a pixel region 35 of the sensor substrate 12. Although an array of the pixels 30 is shown in a simplified manner in FIG. 1, for example, 1024×1024 pixels 30 are disposed in the row direction and the column direction.

Additionally, a plurality of scanning wiring lines 38, which are provided for respective rows of the pixels 30 to control switching states (ON and OFF) of the TFTs 32, and a plurality of signal wiring lines 36, which are provided for respective columns of the pixels 30 and from which electric charges accumulated in the sensor units 34 are read, are provided in a mutually intersecting manner in the radiation detector 10. Each of the plurality of scanning wiring lines 38 is connected to the drive unit 102 via a flexible cable 112A, and thereby, a drive signal for driving the TFT 32 output from the drive unit 102 to control the switching state thereof flows through each of the plurality of scanning wiring lines 38. Additionally, the plurality of signal wiring lines 36 are electrically connected to the signal processing unit 104 via the flexible cable 112B, respectively, and thereby, electric charges read from the respective pixels 30 are output to the signal processing unit 104 as electrical signals. The signal processing unit 104 generates and outputs image data according to the input electrical signals. In addition, in the present embodiment, the term "connection" with respect to the flexible cable 112 means an electrical connection.

The control unit 100 to be described below is connected to the signal processing unit 104, and the image data output from the signal processing unit 104 is sequentially output to the control unit 100. The image memory 106 is connected to the control unit 100, and the image data sequentially output from the signal processing unit 104 is sequentially stored in the image memory 106 under the control of the control unit 100. The image memory 106 has a storage capacity capable of storing image data equivalent to a predetermined number of sheets, and whenever radiographic images are captured, image data obtained by the capturing is sequentially stored in the image memory 106.

The control unit 100 comprises a central processing unit (CPU) 100A, a memory 100B including a read only memory (ROM), a random access memory (RAM), and the like, and a nonvolatile storage unit 100C, such as a flash memory. An example of the control unit 100 is a microcomputer or the like. The control unit 100 controls the overall operation of the radiographic imaging apparatus 1.

In addition, in the radiographic imaging apparatus 1 of the present embodiment, the image memory 106, the control unit 100, and the like are formed in a control substrate 110.

Additionally, common wiring lines 39 are provided in a wiring direction of the signal wiring lines 36 at the sensor units 34 of the respective pixels 30 in order to apply bias voltages to the respective pixels 30. Bias voltages are applied to the respective pixels 30 from a bias power source by electrically connecting the common wiring lines 39 to the bias power source (not shown) outside the sensor substrate 12.

The power source unit 108 supplies electrical power to various elements and various circuits, such as the control unit 100, the drive unit 102, the signal processing unit 104, the image memory 106, and the power source unit 108. In addition, in FIG. 1, an illustration of wiring lines, which connect the power source unit 108 and various elements or various circuits together, is omitted in order to avoid complications.

Figure 2:
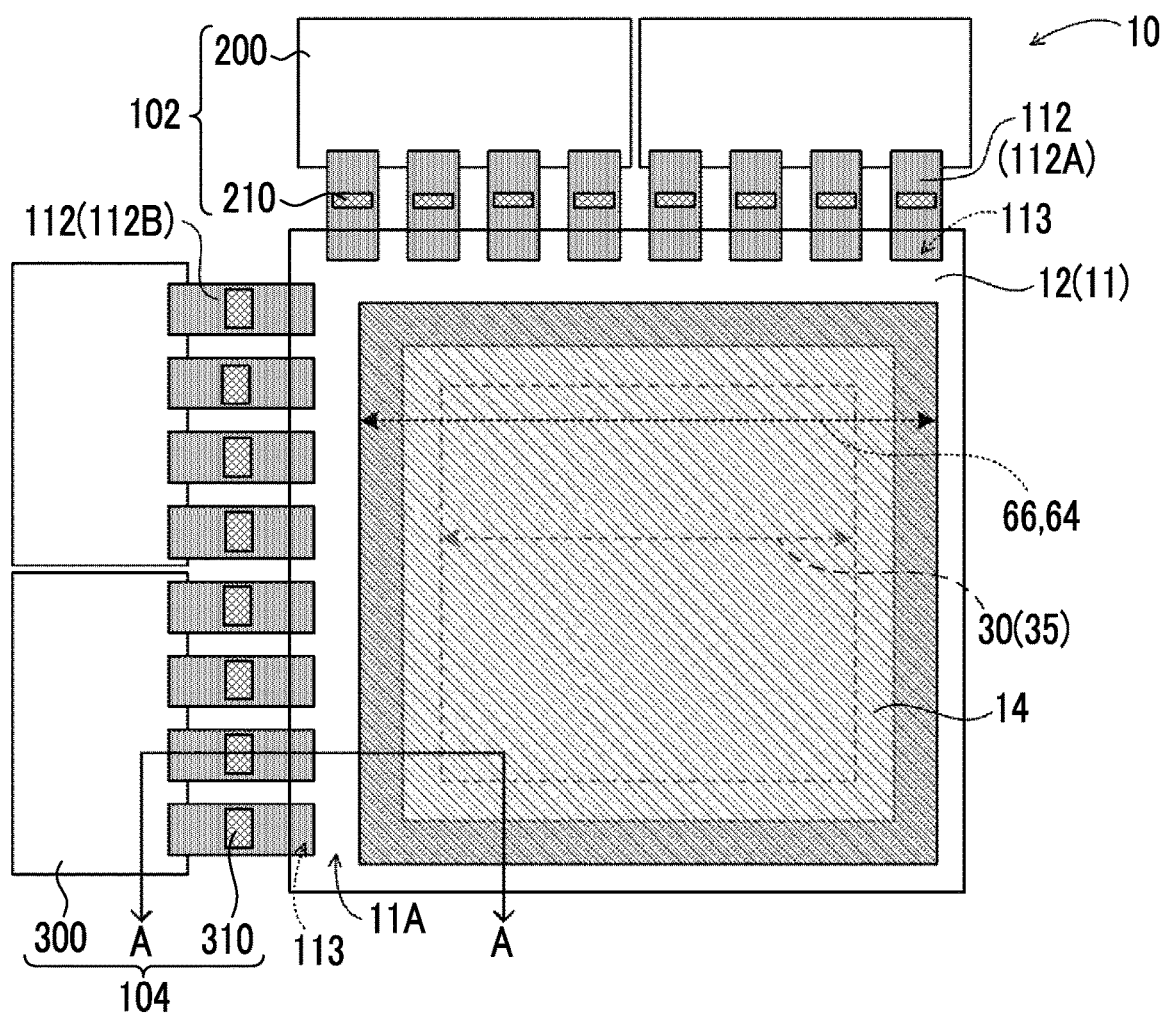
FIG. 2 is a plan view of an example of a radiation detector according to the embodiment as seen from a first surface side of a base material.
Figure 3:
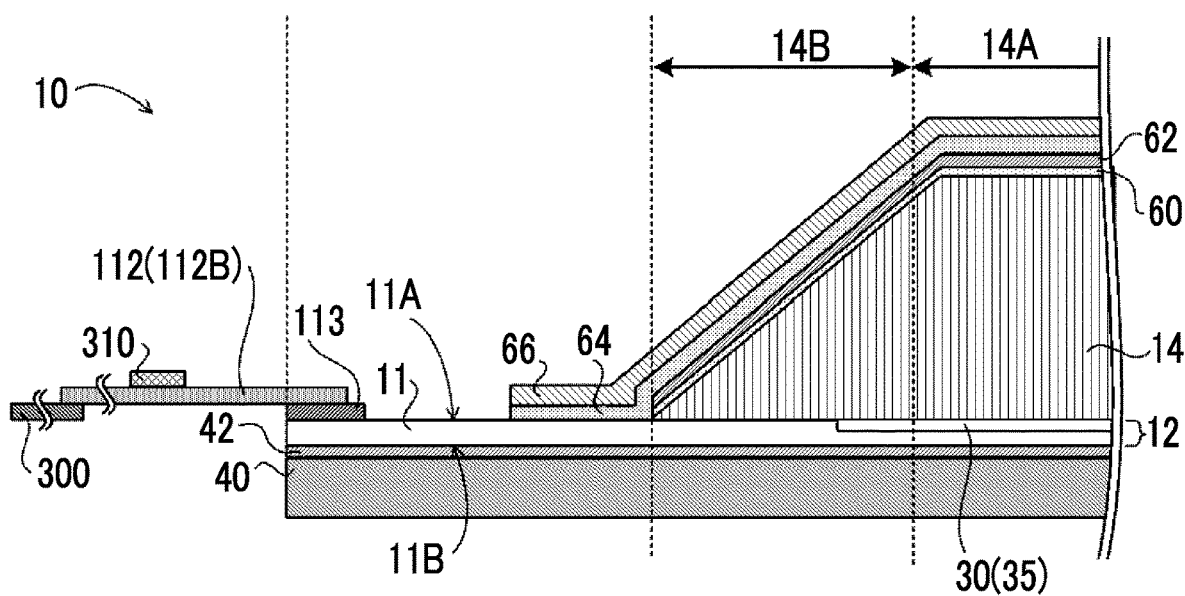
FIG. 3 is a cross-sectional view taken along line A-A of an example of the radiation detector shown in FIG. 2.

Moreover, the radiation detector 10 will be described in detail. FIG. 2 is an example of a plan view of the radiation detector 10 according to the present embodiment as seen from the first surface 11A side of the base material 11. Additionally, FIG. 3 is an example of a cross-sectional view taken along line A-A of the radiation detector 10 in FIG. 2.

The base material 11 is a resin sheet that has flexibility and includes, for example, a plastic such as a polyimide (PI). The thickness of the base material 11 may be a thickness such that desired flexibility is obtained depending on the hardness of a material, the size of the sensor substrate 12, that is, the area of the first surface 11A or the second surface 11B, and the like. In the case where a rectangular base material 11 is alone, an example having flexibility indicates one in which the base material 11 hangs down (becomes lower than the height of the fixed side) 2 mm or more due to the gravity of the base material 11 resulting from its own weight at a position 10 cm away from the fixed side with one side of the base material 11 fixed. As a specific example in a case where the base material 11 is the resin sheet, the thickness thereof may be 5 μm to 125 μm, and the thickness thereof may be more preferably 20 μm to 50 μm.

In addition, the base material 11 has characteristics capable of withstanding the manufacture of the pixels 30 and has characteristics capable of withstanding the manufacture of amorphous silicon TFT (a-Si TFT) in the present embodiment. As such a characteristic of the base material 11, it is preferable that the coefficient of thermal expansion (CTE) at 300° C. to 400° C. is about the same as that of amorphous silicon (a-Si) wafer (for example, ±5 ppm/K), specifically, the coefficient of thermal expansion is preferably 20 ppm/K or less. Additionally, as the heat shrinkage percentage of the base material 11, it is preferable that the heat shrinkage percentage at 400° C. is 0.5% or less with the thickness being 25 μm. Additionally, it is preferable that the modulus of elasticity of the base material 11 does not have a transition point that general PI has, in a temperature range of 300° C. to 400° C., and the modulus of elasticity at 500° C. is 1 GPa or more.

Additionally, it is preferable that the base material 11 of the present embodiment has a fine particle layer containing inorganic fine particles having an average particle diameter of 0.05 μm or more and 2.5 μm or less, which absorbs backscattered ray by itself in order to suppress backscattered rays. In addition, as the inorganic fine particles, in the case of the resinous base material 11, it is preferable to use an inorganic substance of which the atomic number is larger than the atoms constituting the organic substance that is the base material 11 and is 30 or less. Specific examples of such fine particles include $SiO_2$ that is an oxide of Si having an atomic number of 14, MgO that is an oxide of Mg having an atomic number of 12, $Al_2O_3$ that is an oxide of Al having an atomic number of 13, $TiO_2$ that is an oxide of Ti having an atomic number of 22, and the like. A specific example of the resin sheet having such characteristics is XENOMAX (registered trademark).

In addition, the above thicknesses in the present embodiment were measured using a micrometer. The coefficient of thermal expansion was measured according to JIS K7197: 1991. In addition, the measurement was performed by cutting out test pieces from a main surface of the base material 11 while changing the angle by 15 degrees, measuring the coefficient of thermal expansion of each of the cut-out test pieces, and setting the highest value as the coefficient of thermal expansion of the base material 11. The coefficient of thermal expansion is measured at intervals of 10° C. between −50° C. and 450° C. in a machine direction (MD) and a transverse direction (TD), and (ppm/° C.) is converted to (ppm/K). For the measurement of the coefficient of thermal expansion, the TMA4000S apparatus made by MAC Science Co., Ltd. is used, sample length is 10 mm, sample width is 2 mm, initial load is 34.5 g/mm$^2$, and temperature rising rate is 5° C./min, and the atmosphere is in argon.

The base material 11 having desired flexibility is not limited to a resinous material such as the resin sheet. For example, the base material 11 may be a glass substrate or the like having a relatively small thickness. As a specific example of a case where the base material 11 is the glass substrate, generally, in a size of about 43 cm on a side, the glass substrate has flexibility as long as the thickness is 0.3 mm or less. Therefore, any desired glass substrate may be used as long as the thickness is 0.3 mm or less.

As shown in FIGS. 2 and 3, the plurality of pixels 30 are provided on the first surface 11A of the base material 11. In the present embodiment, a region on the first surface 11A of the base material 11 where the pixels 30 are provided is the pixel region 35.

Additionally, the conversion layer 14 is provided on the first surface 11A of the base material 11. The conversion layer 14 of the present embodiment covers the pixel region 35. In the present embodiment, a scintillator including CsI (cesium iodide) is used as an example of the conversion layer 14. It is preferable that such a scintillator includes, for example, CsI:Tl (cesium iodide to which thallium is added) or CsI:Na (cesium iodide to which sodium is added) having an emission spectrum of 400 nm to 700 nm at the time of X-ray radiation. In addition, the emission peak wavelength in a visible light region of CsI:Tl is 565 nm.

In a case where the conversion layer 14 is formed by the vapor-deposition method, as shown in FIG. 3, the conversion layer 14 is formed with an inclination such that the thickness thereof gradually decreases toward an outer edge thereof. In the following, a central region of the conversion layer 14 where the thickness in a case where manufacturing errors and measurement errors are neglected can be considered to be substantially constant is referred to as a central part 14A. Additionally, an outer peripheral region of the conversion layer 14 having a thickness of, for example, 90% or less of the average thickness of the central part 14A of the conversion layer 14 is referred to as a peripheral edge part 14B. That is, the conversion layer 14 has an inclined surface that is inclined with respect to the sensor substrate 12 at the peripheral edge part 14B. In addition, in the following, for convenience of description, in a case where "upper" or "lower" are mentioned on the sensor substrate 12, the conversion layer 14 is used as a reference, the side of the conversion layer 14 facing with the sensor substrate 12 is referred to as "lower", and the opposite side is referred to as "upper". For example, the conversion layer 14 is provided on the sensor substrate 12, and the inclined surface of the peripheral edge part 14B of the conversion layer 14 is inclined in a state where the conversion layer 14 gradually expands from the upper side to the lower side.

Additionally, as shown in FIG. 3, a pressure sensitive adhesive layer 60, a, reflective layer 62, an adhesive layer 64, and a protective layer 66 are provided on the conversion layer 14 of the present embodiment.

The pressure sensitive adhesive layer 60 covers the entire surface of the conversion layer 14. The pressure sensitive adhesive layer 60 has a function of fixing the reflective layer 62 to the conversion layer 14. The pressure sensitive adhesive layer 60 preferably has optical transmittance. As materials of the pressure sensitive adhesive layer 60, for example, an acrylic pressure sensitive adhesive, a hot-melt pressure sensitive adhesive, and a silicone adhesive can be used. Examples of the acrylic pressure sensitive adhesive include urethane acrylate, acrylic resin acrylate, epoxy acrylate, and the like. Examples of the hot-melt pressure sensitive adhesive include thermoplastics, such as ethylene-vinyl acetate copolymer resin (EVA), ethylene-acrylate copolymer resin (EAA), ethylene-ethyl acrylate copolymer resin (EEA), and ethylene-methyl methacrylate copolymer (EMMA). The thickness of the pressure sensitive adhesive layer 60 is preferably 2 µm or more and 7 µm or less. By setting the thickness of the pressure sensitive adhesive layer 60 to 2 µm or more, the effect of fixing the reflective layer 62 on the conversion layer 14 can be sufficiently exhibited. Moreover, the risk of forming an air layer between the conversion layer 14 and the reflective layer 62 can be suppressed. When an air layer is formed between the conversion layer 14 and the reflective layer 62, there is a concern that multiple reflections may be caused in which the light emitted from the conversion layer 14 repeats reflections between the air layer and the conversion layer 14 and between the air layer and the reflective layer 62. Additionally, by setting the thickness of the pressure sensitive adhesive layer 60 to 7 µm or less, it is possible to suppress a decrease in modulation transfer function (MTF) and detective quantum efficiency (DQE).

The reflective layer 62 covers the entire surface of the pressure sensitive adhesive layer 60. The reflective layer 62 has a function of reflecting the light converted by the conversion layer 14. The material of the reflective layer 62 is preferably made of a resin material containing a metal or a metal oxide. As the material of the reflective layer 62, for example, white PET (Polyethylene terephthalate), $TiO_2$, $Al_2O_3$, foamed white PET, specular reflective aluminum, and the like can be used. White PET is obtained by adding a white pigment such as $TiO_2$ or barium sulfate to PET, and foamed white PET is white PET having a porous surface. Additionally, as the material of the reflective layer 62, a laminated film of a resin film and a metal film may be used. Examples of the laminated film of the resin film and the metal film include an Alpet (registered trademark) sheet in which aluminum is laminated by causing an aluminum foil to adhere to an insulating sheet (film) such as polyethylene terephthalate. The thickness of the reflective layer 62 is preferably 10 µm or more and 40 µm or less. In this way, by comprising the reflective layer 62 on the conversion layer 14, the light converted by the conversion layer 14 can be efficiently guided to the pixels 30 of the sensor substrate 12.

The adhesive layer 64 covers the entire surface of the reflective layer 62. An end part of the adhesive layer 64 extends to the first surface 11A of the base material 11. That is, the adhesive layer 64 adheres to the base material 11 of the sensor substrate 12 at the end part thereof. The adhesive layer 64 has a function of fixing the reflective layer 62 and the protective layer 66 to the conversion layer 14. As the material of the adhesive layer 64, the same material as the material of the pressure sensitive adhesive layer 60 can be used, but the adhesive force of the adhesive layer 64 is preferably larger than the adhesive force of the pressure sensitive adhesive layer 60.

The protective layer 66 is provided so as to cover the entire conversion layer 14 and covers a part of the sensor substrate 12 at the end part thereof. The protective layer 66 functions as a moistureproof film that prevents moisture from entering the conversion layer 14. As the material of the protective layer 66, for example, organic films containing organic substances such as PET, polyphenylene sulfide (PPS), oriented polypropylene (OPP: biaxially oriented polypropylene film), polyethylene naphthalate (PEN), and PI, and Parylene (registered trademark) can be used. Additionally, as the protective layer 66, a laminated film of a resin film and a metal film may be used. Examples of the laminated film of the resin film and the metal film include ALPET (registered trademark) sheets.

Meanwhile, as shown in FIGS. 2 and 3, a plurality (16 in FIG. 2) of the terminals 113 are provided on an outer edge part of the first surface 11A of the base material 11. The terminal 113 of the present embodiment is an example of the terminal portion of the present disclosure. An anisotropic conductive film or the like is used as the terminals 113. As shown in FIGS. 2 and 3, the flexible cable 112 is electrically connected to each of the plurality of terminals 113. Specifically, as shown in FIG. 2, the flexible cable 112A is thermocompression-bonded to each of the plurality of (eight in FIG. 2) terminals 113 provided on one side of the base material 11. The flexible cable 112A is a so-called chip on film (COF), and a driving integrated circuit (IC) 210 is mounted on the flexible cable 112A. The driving IC 210 is connected to each of a plurality of signal lines included in the flexible cable 112A. In addition, in the present embodiment, the flexible cable 112A and the flexible cable 112B to be described below are simply referred to as "flexible cable 112" in a case where the cables are collectively referred to without distinction. Additionally, the flexible cable 112 of the present embodiment is an example of a cable of the present disclosure.

The other end of the flexible cable 112A opposite to the one end electrically connected to the terminal 113 of the sensor substrate 12 is electrically connected to the driving substrate 200. As an example, in the present embodiment, the plurality of signal lines included in the flexible cable 112A are thermocompression-bonded to the driving substrate 200 and thereby electrically connected to circuits and elements (not shown) mounted on the driving substrate 200.

The driving substrate 200 of the present embodiment is a flexible printed circuit board (PCB), which is a so-called flexible substrate. Additionally, circuit components (not shown) mounted on the driving substrate 200 are components mainly used for processing digital signals (hereinafter, referred to as "digital components"). Digital components tend to have a relatively smaller area (size) than analog components to be described below. Specific examples of the digital components include digital buffers, bypass capacitors, pull-up/pull-down resistors, damping resistors, electromagnetic compatibility (EMC) countermeasure chip components, power source ICs, and the like. In addition, the driving substrate 200 may be not necessarily a flexible substrate and may be a non-flexible rigid substrate or a rigid flexible substrate.

In the present embodiment, the drive unit 102 is realized by the driving substrate 200 and the driving IC 210 mounted on the flexible cable 112A. In addition, the driving IC 210 includes, among various circuits and elements that realize the drive unit 102, circuits different from the digital components mounted on the driving substrate 200.

Meanwhile, the flexible cable 112B is electrically connected to each of the plurality (8 in FIG. 2) of terminals 113 provided on a side intersecting with one side of the base material 11 to which the flexible cable 112A is electrically connected. Similarly to the flexible cable 112A, the flexible cable 112B is a so-called chip on film (COF), and a signal processing IC 310 is mounted on the flexible cable 112B. The signal processing IC 310 is connected to a plurality of signal lines (not shown) included in the flexible cable 112B.

The other end of the flexible cable 112B opposite to one end electrically connected to the terminal 113 of the sensor substrate 12 is electrically connected to the signal processing substrate 300. As an example, in the present embodiment, the plurality of signal lines included in the flexible cable 112B are thermocompression-bonded to the signal processing substrate 300 and thereby connected to the circuits and elements (not shown) mounted on the signal processing substrate 300.

The signal processing substrate 300 of the present embodiment is a flexible PCB, which is a so-called flexible substrate, similarly to the above-described driving substrate 200. Circuit components (not shown) mounted on the signal processing substrate 300 are components mainly used for processing analog signals (hereinafter referred to as "analog components"). Specific examples of the analog components include charge amplifiers, analog-to-digital converters (ADCs), digital-to-analog converters (DAC), and power source ICs. Additionally, the circuit components of the present embodiment also include coils around a power source, which has a relatively large component size, and large-capacity smoothing capacitors. In addition, the signal processing substrate 300 may not be necessarily a flexible substrate and may be a non-flexible rigid substrate or a rigid flexible substrate.

In the present embodiment, the signal processing unit 104 is realized by the signal processing substrate 300 and the signal processing IC 310 mounted on the flexible cable 112B. In addition, the signal processing IC 310 includes, among various circuits and elements that realize the signal processing unit 104, circuits different from the analog components mounted on the signal processing substrate 300.

In addition, in FIG. 2, an embodiment in which a plurality of (two) the driving substrates 200 and a plurality of (two) the signal processing substrates 300 are provided has been described. However, the number of driving substrates 200 and the number of signal processing substrates 300 are not limited to those shown in FIG. 2. For example, a form may be adopted in which at least one of the driving substrate 200 or the signal processing substrate 300 may be a single substrate.

Meanwhile, as shown in FIG. 3, in the radiation detector 10 of the present embodiment, the flexible cable 112 is thermocompression-bonded to the terminal 113, and thereby the flexible cable 112 is electrically connected to the terminal 113. In addition, although FIG. 3 shows an example of a structure relating to the electrical connection between the flexible cable 112B and the radiation detector 10, a structure related to the electrical connection between the flexible cable 112A and the radiation detector 10 of the present embodiment is also the same as the form shown in FIG. 3.

Additionally, as shown in FIG. 3, a reinforcing member 40 is provided by a pressure sensitive adhesive 42 on the second surface 11B of the base material 11 opposite to the first surface 11A in the sensor substrate 12 of the radiation detector 10 of the present embodiment. As an example, the reinforcing member 40 of the present embodiment is provided over the entire second surface 11B of the base material 11.

The reinforcing member 40 has a function of reinforcing the strength of the base material 11. The reinforcing member 40 of the present embodiment is higher in bending stiffness than the base material 11, and the dimensional change (deformation) thereof with respect to a force applied in a direction perpendicular to the surface opposite to the conversion layer 14 is smaller than the dimensional change (deformation) thereof with respect to a force applied in the direction perpendicular to the second surface 11B of the base material 11. Examples of the material of the reinforcing member 40 include carbon, plastic, and the like. In addition, the reinforcing member 40 may include a plurality of materials or may be, for example, a laminate of plastic and carbon.

In addition, specifically, the bending stiffness of the reinforcing member 40 is preferably 100 times or more the bending stiffness of the base material 11. Additionally, the thickness of the reinforcing member 40 of the present embodiment is larger than the thickness of the base material 11. For example, in a case where XENOMAX (registered trademark) is used as the base material 11, the thickness of the reinforcing member 40 is preferably about 0.2 mm to 0.25 mm.

Specifically, a material having a bending modulus of elasticity of 150 MPa or more and 2,500 MPa or less is preferably used for the reinforcing member 40 of the present embodiment. From the viewpoint of suppressing the deflection of the base material 11, the reinforcing member 40 preferably has a higher bending stiffness than the base material 11. In addition, in a case where the bending modulus of elasticity becomes low, the bending stiffness also becomes low. In order to obtain a desired bending stiffness, the thickness of the reinforcing member 40 should be made large, and the thickness of the entire radiation detector 10 increases. Considering the above-described material of the reinforcing member 40, the thickness of the reinforcing member 40 tends to be relatively large in a case where a bending stiffness exceeding 140,000 Pacm$^4$ is to be obtained. For that reason, in view of obtaining appropriate stiffness and considering the thickness of the entire radiation detector 10, the material used for the reinforcing member 40 preferably has a bending modulus of elasticity of 150 MPa or more and 2,500 MPa or less. Additionally, the bending stiffness of the reinforcing member 40 is preferably 540 Pacm$^4$ or more and 140,000 Pacm$^4$ or less.

Additionally, the coefficient of thermal expansion of the reinforcing member 40 of the present embodiment is preferably closer to the coefficient of thermal expansion of the material of the conversion layer 14, and the ratio of the coefficient of thermal expansion of the reinforcing member 40 to the coefficient of thermal expansion of the conversion layer 14 (the coefficient of thermal expansion of the reinforcing member 40/the coefficient of thermal expansion of the conversion layer 14) is more preferably 0.5 or more and 2 or less. The coefficient of thermal expansion of such a reinforcing member 40 is preferably 30 ppm/K or more and 80 ppm/K or less. For example, in a case where the conversion layer 14 has CsI:Tl as a material, the coefficient of thermal expansion is 50 ppm/K. In this case, examples of materials relatively close to the conversion layer 14 include polyvinyl chloride (PVC) having a coefficient of thermal expansion of 60 ppm/K to 80 ppm/K, acrylic having a coefficient of thermal expansion of 70 ppm/K to 80 ppm/K, PET having a coefficient of thermal expansion of 65 ppm/K to 70 ppm/K, polycarbonate (PC) having a coefficient of thermal expansion of 65 ppm/K, Teflon (registered trademark) having a coefficient of thermal expansion of 45 ppm/K to 70 ppm/K, and the like. Moreover, considering the above-described bending modulus of elasticity, the material of the reinforcing member 40 is more preferably a material containing at least one of PET or PC.

From the viewpoint of elasticity, the reinforcing member 40 preferably contains a material having a yield point. In addition, in the present embodiment, the "yield point" means a phenomenon in which the stress rapidly decreases once in a case where the material is pulled, means that the strain is increased without increasing the stress on a curve representing a relationship between the stress and the strain, and indicates the peak of a stress-strain curve in a case where a tensile strength test is performed on the material. Resins having the yield point generally include resins that are hard and strongly sticky, and resins that are soft and strongly sticky and have medium strength. Examples of the hard and strongly sticky resins include PC and the like. Additionally, examples of the resins that are soft and strongly sticky and have medium strength include polypropylene and the like.

In a case where the reinforcing member 40 of the present embodiment is a substrate having plastic as a material, the material is preferably a thermoplastic resin for the above-described reasons, and include at least one of PC, PET, styrol, acrylic, polyacetase, nylon, polypropylene, acrylonitrile butadiene styrene (ABS), engineering plastics, or polyphenylene ether. In addition, the reinforcing member 40 is preferably at least one of polypropylene, ABS, engineering plastics, PET, or polyphenylene ether among these, is more preferably at least one of styrol, acrylics, polyacetase, or nylon, and is even more preferably at least one of PC or PET.

Figure 4A:
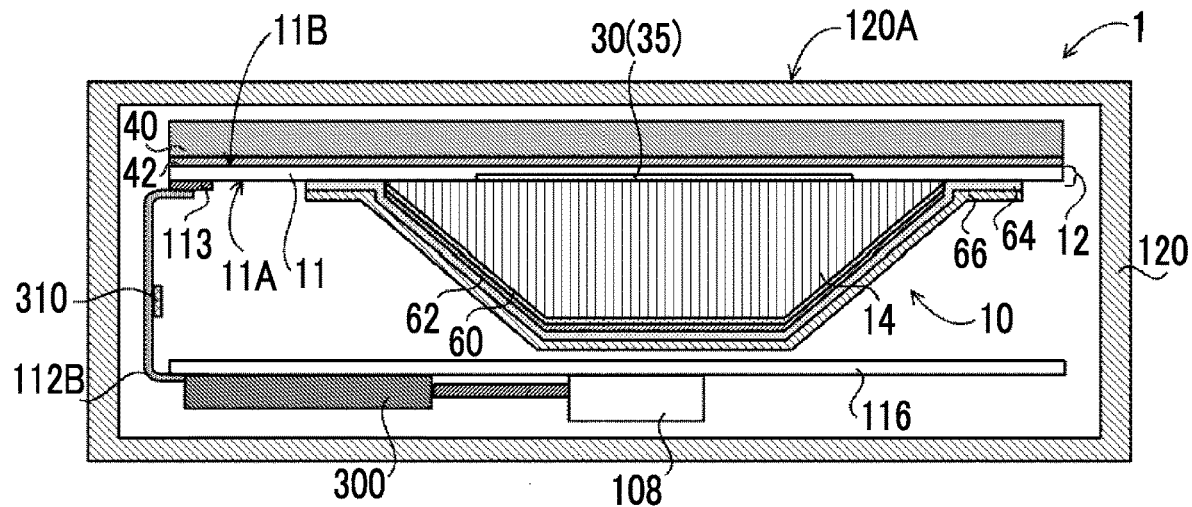
FIG. 4A is a cross-sectional view of an example of the radiographic imaging apparatus according to the embodiment.

Moreover, the radiographic imaging apparatus 1 will be described in detail. FIG. 4A is an example of a cross-sectional view of a radiographic imaging apparatus 1 in a case where the radiation detector 10 of the present embodiment is applied to an irradiation side sampling (ISS) type in which radiation is emitted from the second surface 11B side of the base material 11. Additionally, FIG. 9B is an example of a cross-sectional view of the radiographic imaging apparatus 1 in a case where the radiation detector 10 of the present embodiment is applied to the penetration side sampling (PSS) type in which radiation is emitted from the conversion layer 14 side.

Figure 4B:
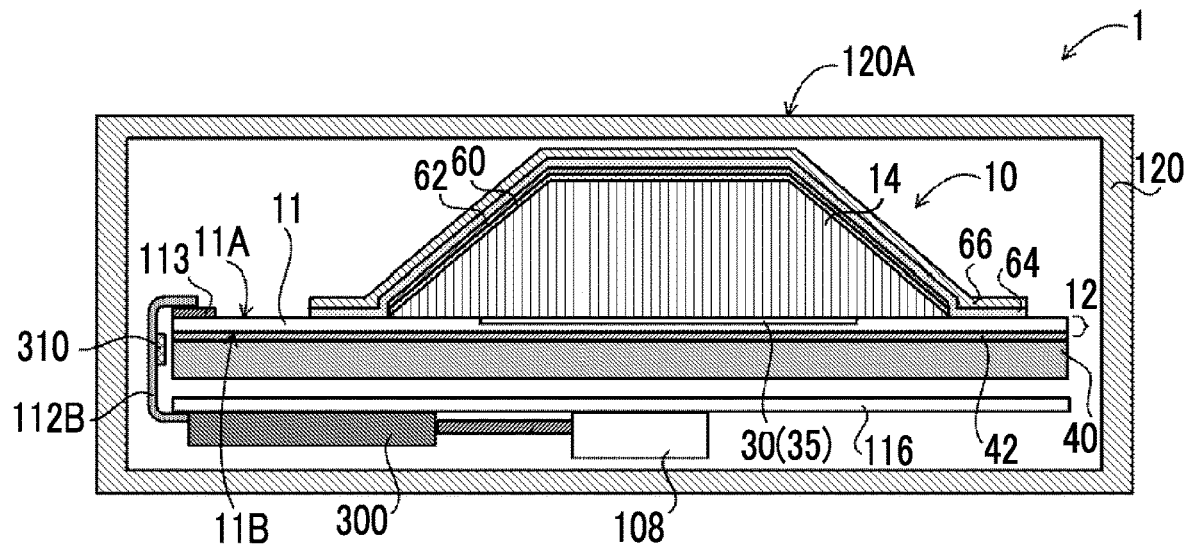
FIG. 4B is a cross-sectional view of an example of the radiographic imaging apparatus according to the embodiment.

The radiographic imaging apparatus 1 formed of the above radiation detector 10 is used while being housed in a housing 120, as shown in FIGS. 4A and 4B. As shown in FIGS. 4A and 4B, the radiation detector 10, the power source unit 108, and the circuit board such as the signal processing substrate 300 are provided side by side in an incidence direction of radiation within the housing 120. The radiation detector 10 of FIG. 4A is disposed in a state where the second surface 11B of the base material 11 faces a top plate on an irradiation surface 120A side of the housing 120 that is irradiated with the radiation transmitted through a subject. More specifically, the reinforcing member 40 is disposed so as to face the top plate on the irradiation surface 120A side of the housing 120. Additionally, the radiation detector 10 of FIG. 4B is disposed in a state where the first surface 11A side of the base material 11 faces the top plate on the irradiation surface 120A side of the housing 120. More specifically, an upper surface of the conversion layer 14 is disposed so as to face the top plate on the irradiation surface 120A side of the housing 120.

Additionally, a middle plate 116 is further provided on a side from which the radiation transmitted through the radiation detector 10 is emitted, within the housing 120 as shown in FIGS. 4A and 4B. The middle plate 116 is, for example, an aluminum or copper sheet. The copper sheet does not easily generate secondary radiation due to incident radiation, and therefore, has a function of preventing scattering backward, that is, the conversion layer 14 side. In addition, it is preferable that the middle plate 116 covers at least an entire surface of the conversion layer 14 from which radiation is emitted, and covers the entire conversion layer 14. Additionally, a circuit board such as a signal processing substrate 300 is fixed to the middle plate 116.

The housing 120 is preferably lightweight, has a low absorbance of radiation, particularly X-rays, has a high stiffness, and is more preferably made of a material having a sufficiently high modulus of elasticity. As the material of the housing 120, it is preferable to use a material having a bending modulus of elasticity of 10,000 MPa or more. As the material of the housing 120, carbon or CFRP having a bending modulus of elasticity of about 20,000 MPa to 60,000 MPa can be suitably used.

In the capturing of a radiographic image by the radiographic imaging apparatus 1, a load from a subject is applied to the irradiation surface 120A of the housing 120. In a case where the stiffness of the housing 120 is insufficient, there are concerns that problems may occur such that the sensor substrate 12 is deflected due to the load from the subject and the pixels 30 are damaged. By housing the radiation detector 10 inside the housing 120 consisting of a material having a bending modulus of elasticity of 10,000 MPa or more, it is possible to suppress the deflection of the sensor substrate 12 due to the load from the subject.

In addition, the housing 120 may be formed of different materials for the irradiation surface 120A of the housing 120 and other portions. For example, a portion corresponding to the irradiation surface 120A may be formed of a material having a low radiation absorbance and high stiffness and having a sufficiently high modulus of elasticity, and the other portions may be formed of a material different from the portion corresponding to the irradiation surface 120A, for example, a material having a lower modulus of elasticity than the portion of the irradiation surface 120A.

In addition, since a porous layer knot shown) of the present embodiment has a plurality of through-holes knot shown), the amount of radiation transmitted differs between the portions of the through-holes and portions other than the through-holes. Accordingly, there is a case where the amount of radiation that reaches the conversion layer 14 differs. In this case, there is a concern that image unevenness may occur in a radiographic image obtained by the radiation detector 10. For that reason, the radiation detector 10 of the present embodiment is preferably applied to the ISS type radiographic imaging apparatus 1.

Figure 5:
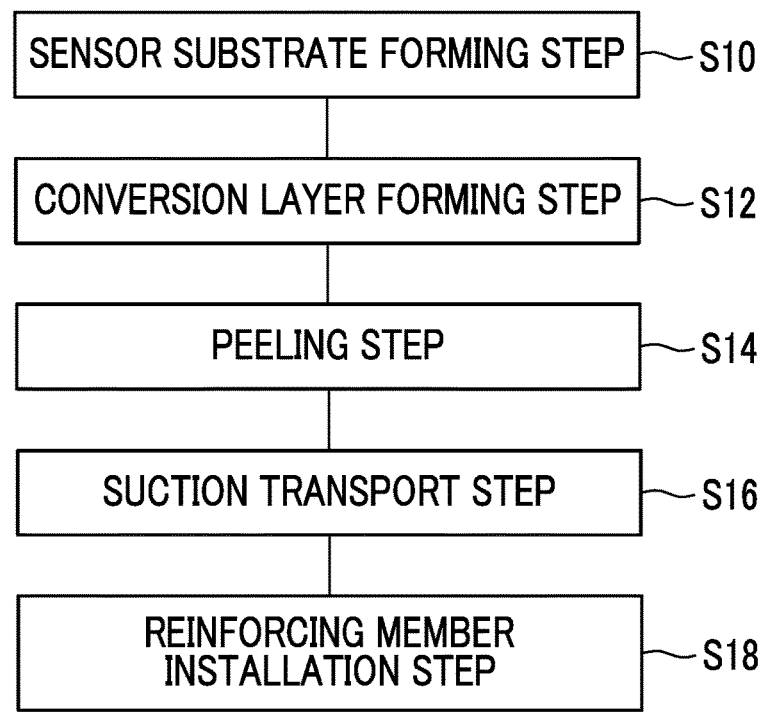
FIG. 5 is a flowchart showing an example of a flow of a manufacturing process of the radiographic imaging apparatus of the embodiment.

A method of manufacturing the radiographic imaging apparatus 1 according to the present embodiment will be described. FIG. 5 is a flowchart showing a flow of a manufacturing process of the radiation detector 10 of the present embodiment.

In the present embodiment, as shown in FIG. 5, first, a sensor substrate forming step of Step S10 is carried out. The substrate forming step of the present embodiment includes a step of forming the sensor substrate 12 and a step of providing the terminal 113 on the first surface 11A of the base material 11 of the sensor substrate 12.

Figure 6:
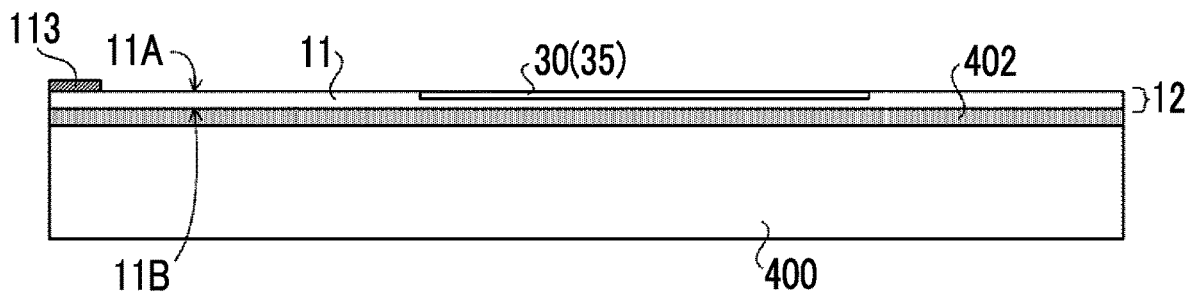
FIG. 6 is a view for explaining an example of a sensor substrate forming step.

As shown in FIG. 6, in the step of forming the sensor substrate 12, the base material 11 is provided on a support body 400, such as a glass substrate having a thickness larger than that of the base material 11, via a peeling layer 402, for example in order to form the sensor substrate 12. For example, in a case where the base material 11 is formed by a lamination method, a sheet to be the base material 11 is bonded onto the support body 400. The second surface 11B of the base material 11 is in contact with the peeling layer 402. In addition, the method of forming the base material 11 is not limited to the present embodiment. For example, a form may be adopted in which the base material 11 is formed by an application method.

Moreover, in the step of providing the terminal 113, the pixels 30 and the terminal 113 are formed on the first surface 11A of the base material 11. The pixel 30 is formed via an undercoat layer (not shown) formed of SiN or the like in the pixel region 35 of the first surface 11A. Additionally, a plurality of the terminals 113 are formed along each of two sides of the base material 11.

Next, the conversion layer forming step of Step S12 is carried out. The conversion layer forming step of the present embodiment includes a step of providing the conversion layer 14 on the sensor substrate 12 and a step of connecting the circuit board to the terminal 113 via the flexible cable 112.

Figure 7A:
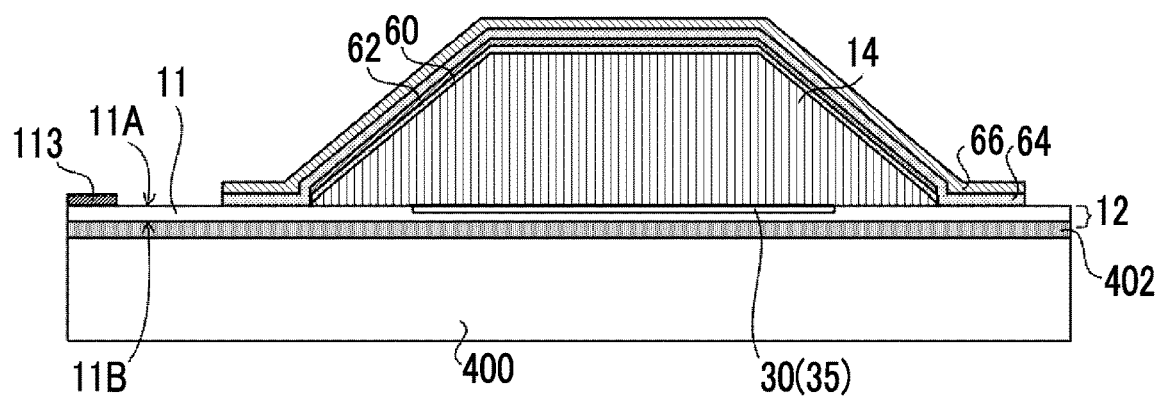
FIG. 7A is a view for explaining an example of a conversion layer forming step.

In the step of providing the conversion layer 14, as shown in FIG. 7A, the conversion layer 14 is formed on the layer on which the pixels 30 are formed (hereinafter, simply referred to as "pixels 30"). In the present embodiment, the conversion layer 14 of CsI is directly formed as a columnar crystal on the sensor substrate 12 by vapor-deposition methods, such as a vacuum vapor-deposition method, a sputtering method, and a chemical vapor deposition (CVD) method. In this case, the side of the conversion layer 14 in contact with the pixels 30 is a growth-direction base point side of the columnar crystal.

In addition, in a case where a CsI scintillator is used as the conversion layer 14, the conversion layer 14 can be formed on the sensor substrate 12 by a method different from the method of the present embodiment. For example, the conversion layer 14 may be formed on the sensor substrate 12 by preparing one in which CsI is vapor-deposited on an aluminum or carbon substrate or the like by a vapor-deposition method and bonding a side of the CsI, which is not in contact with the substrate, and the pixels 30 of the sensor substrate 12 to each other with a pressure sensitive adhesive sheet or the like. In this case, it is preferable that one in which the entire conversion layer 14 also including a substrate of aluminum or the like is covered with a protective layer is bonded to the pixels 30 of the sensor substrate 12. In addition, in this case, the side of the pixel 30 in contact with the conversion layer 14 is a distal end side in the growth direction of the columnar crystal.

Moreover, the reflective layer 62 is provided on the conversion layer 14 formed on the sensor substrate 12 via the pressure sensitive adhesive layer 60. Moreover, the protective layer 66 is provided via the adhesive layer 64.

Figure 7B:
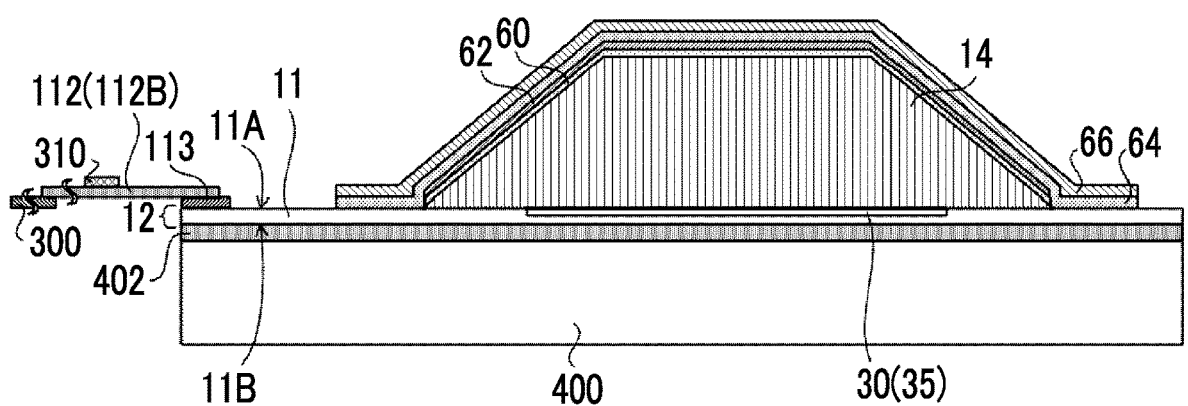
FIG. 7B is a view for explaining the example of the conversion layer forming step.

Additionally, in the step of connecting the circuit board to the terminal 113, as shown in FIG. 7B, the flexible cable 112 is electrically connected to the sensor substrate 12. Specifically, the flexible cable 112 on which the driving IC 210 or the signal processing IC 310 is mounted is thermocompression-bonded to the terminal 113 to electrically connect the terminal 113 and the flexible cable 112. Accordingly, the flexible cable 112 is electrically connected to the sensor substrate 12.

Next, a peeling step of Step S14 is carried out. In the peeling step, the sensor substrate 12 to which the circuit board is connected via the flexible cable 112 is peeled from the support body 400.

Figure 8:
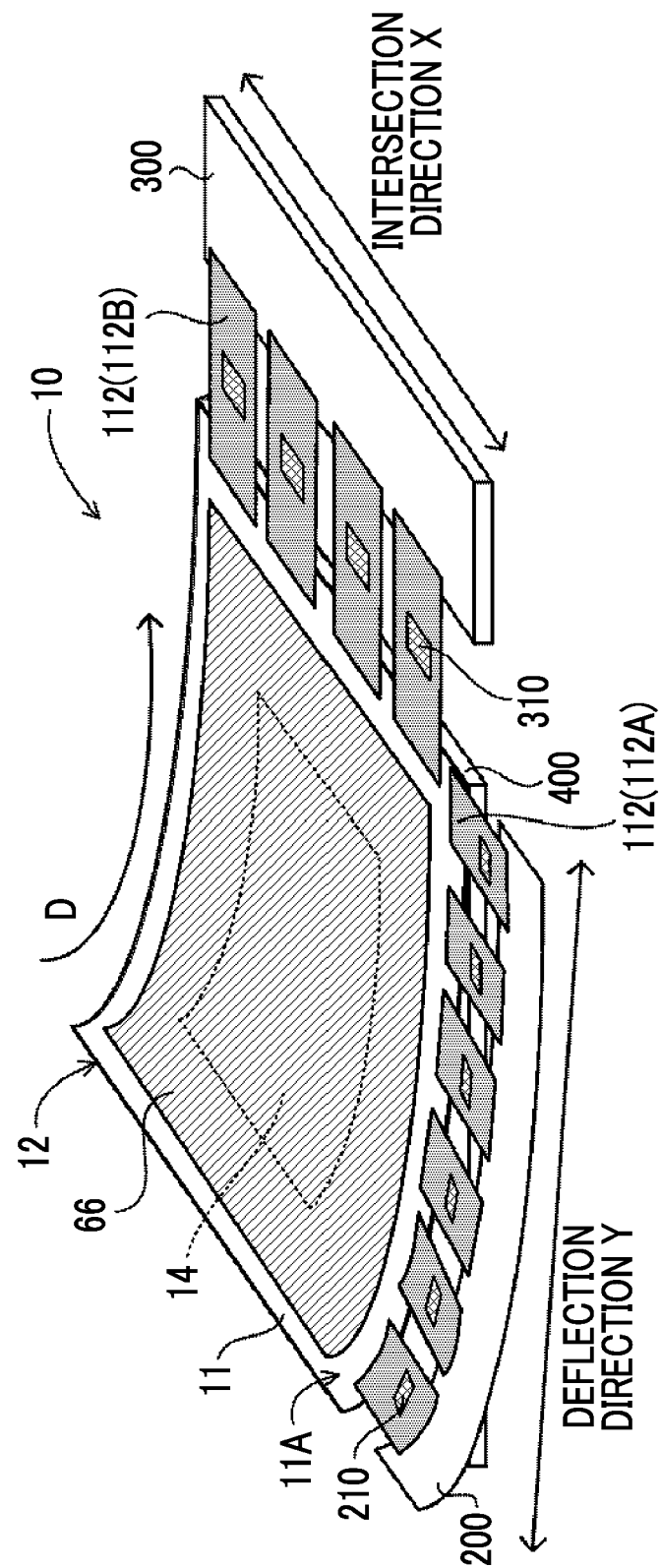
FIG. 8 is a view for explaining an example of a peeling step.

As an example, in the present embodiment, as shown in FIG. 8, the sensor substrate 12 provided with the conversion layer 14 is peeled from the support body 400 by so-called mechanical peeling. In the example shown in FIG. 8, the sensor substrate 12 is peeled from the support body 400 by setting the side of the base material 11 of the sensor substrate 12 opposite to the side to which the flexible cable 112B is electrically connected as a peeling starting point and gradually pulling the sensor substrate 12 off the support body 400 in the direction of an arrow D shown in FIG. 8 from the side to be the starting point toward the side to which the flexible cable 112 is electrical connected.

In addition, it is preferable that the side to be the peeling starting point is a side that intersects the longest side in a case where the sensor substrate 12 is seen in a plan view. In other words, the side in a deflection direction Y in which the deflection is caused by the peeling is preferably the longest side. As an example, in the present embodiment, the peeling starting point is the side opposite to the side to which the flexible cable 112B is electrically connected.

In addition, the method of peeling the sensor substrate 12 from the support body 400 is not limited to the mechanical peeling shown in the present embodiment. For example, the sensor substrate 12 may be peeled from the support body 400 by laser peeling (laser lift off). Additionally, in the laser peeling, the sensor substrate 12 may be peeled from the support body 400 by radiating a laser beam from a back surface (a surface opposite to the surface on which the sensor substrate 12 is provided) of the support body 400 and by decomposing the peeling layer 402 with the laser beam transmitted through the support body 400.

Figure 9:
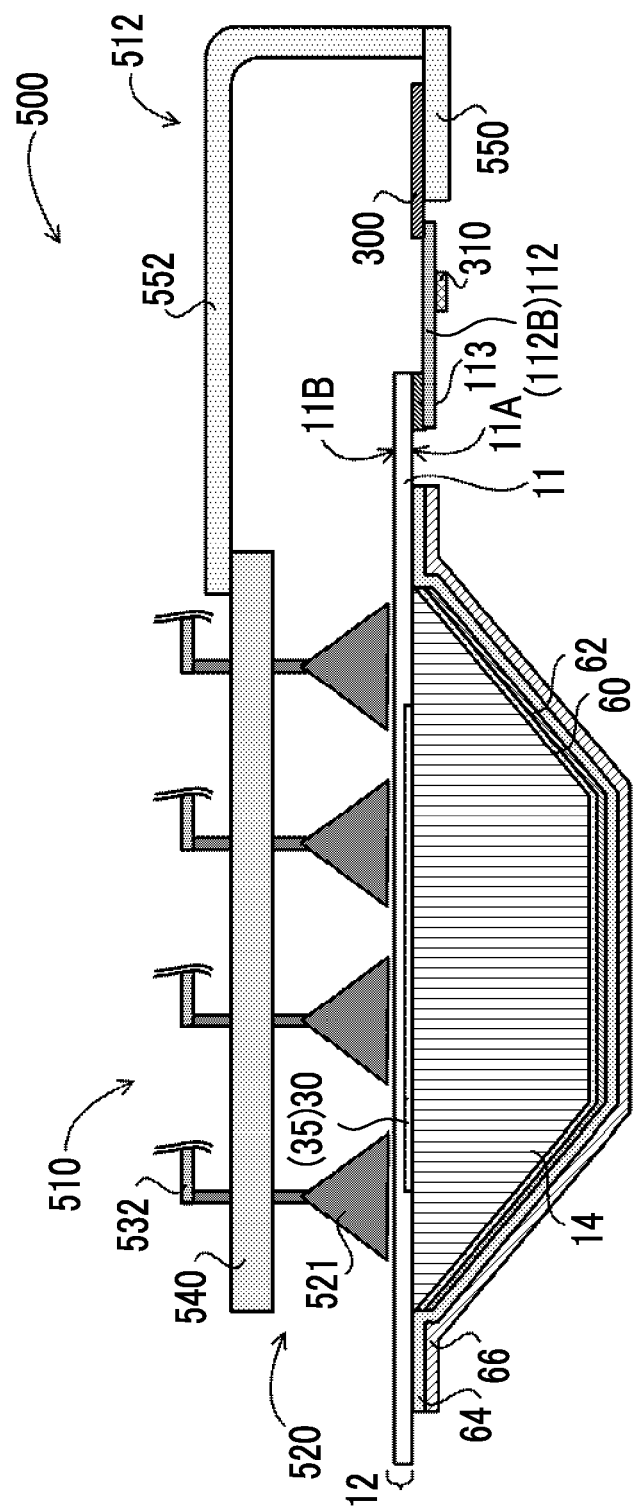
FIG. 9 is a view for explaining an example of a suction transport step.

Next, a suction transport step of Step S16 is carried out. The suction transport step is a step of transporting the sensor substrate 12 from a peeling device for peeling the sensor substrate 12 from the support body 400 to a device for performing the next step (a reinforcing member installation step that is Step S18 described below). In the present embodiment, as shown in FIG. 9, the sensor substrate 12 is held and transported by suctioning the sensor substrate 12 by a suction member 520 provided on a transport jig 500.

Figure 10A:
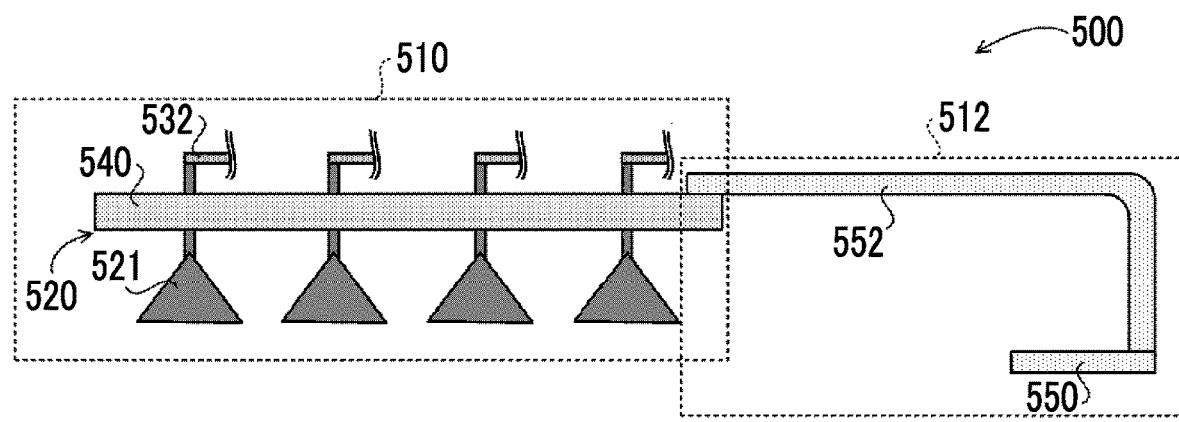
FIG. 10A is a view showing a side surface of an example of a transport jig.

The transport jig 500 of the present embodiment will be described with reference to FIGS. 10A to 10D. FIG. 10A shows a side view of an example of the transport jig 500 of the present embodiment. The transport jig 500 of the present embodiment includes a suction unit 510 having a plurality of the suction members 520 and a holding part 512 having a holding member 550.

Figure 10B:
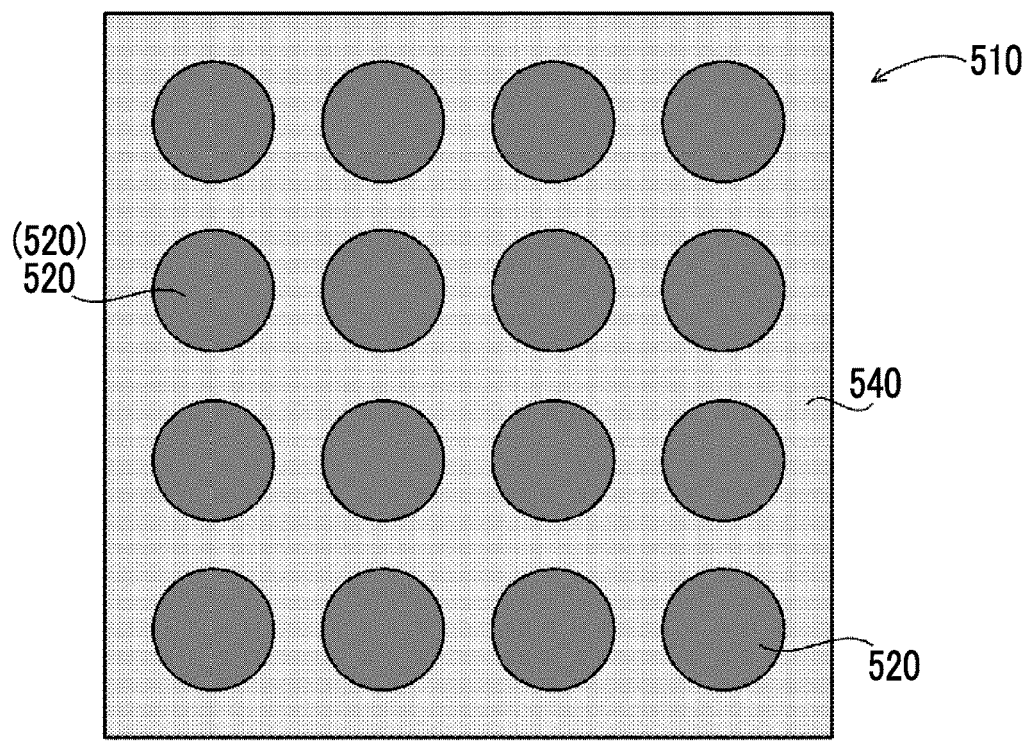
FIG. 10B is an example of a plan view of a suction unit as seen from a direction in which a suction pad of a suction member is provided.
Figure 10C:
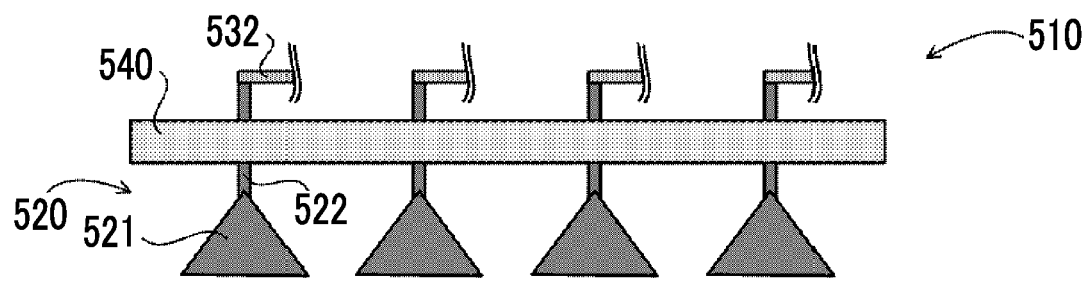
FIG. 10C is an example of a side view of the suction unit as seen from a side.
Figure 10D:
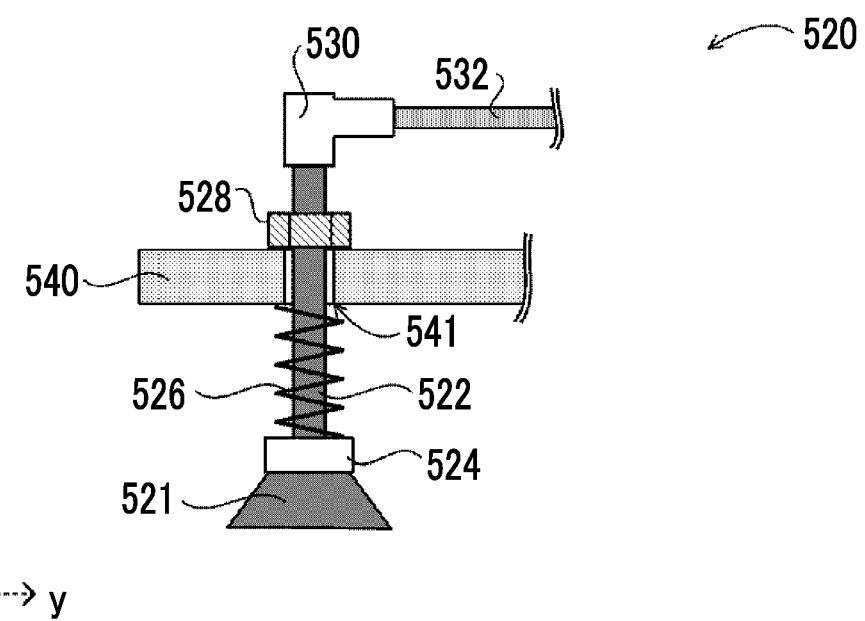
FIG. 10D is an example of a side view of the suction member.

The suction unit 510 of the present embodiment will be described in detail with reference to FIGS. 10B to 10D. FIG. 10B shows an example of a plan view of the suction unit 510 as seen from a direction in which a suction pad 521 of the suction member 520 is provided. Additionally, FIG. 10C shows an example of a side view of the suction unit 510 as seen from a side. Additionally, FIG. 10D shows an example of a side view of the suction member 520.

The suction unit 510 of the present embodiment has a plurality of (16 in the present embodiment) the suction members 520, and the suction members 520 support the entire surface of the first surface 11A of the base material 11.

Each suction member 520 includes a suction pad 521, a shaft portion 522, an adapter 524, a buffer member 526, a nut 528, a connecting member 530, and a hose 532.

The suction pad 521 has a function of suctioning the sensor substrate 12. As an example, the suction pad 521 of the present embodiment suctions the second surface 11B of the base material 11 of the sensor substrate 12 as shown in FIG. 9 and the like. As an example, in the present embodiment, a relatively soft member such as rubber or sponge is used as the material of the suction pad 521.

The suction pad 521 is connected to the shaft portion 522 having an internal cavity (not shown) by the adapter 524. The inside of the suction pad 521 and the cavity portion of the shaft portion 522 penetrate through each other. The shaft portion 522 is inserted through a hole 541 provided in a base 540, and a buffer member 526 is provided between the base 540 and the suction pad 521.

The buffer member 526 has a function of absorbing the unevenness of the base material 11 suctioned by the suction pad 521. Since the unevenness is present in the base material 11, the first surface 11A of the base material 11 may not become a perfectly flat surface (for example, horizontal), and unevenness, in other words, distortion may occur. In the transport jig 500 of the present embodiment, the buffer member 526 can support the sensor substrate 12 substantially horizontally by absorbing such unevenness of the base material 11. As an example, in the present embodiment, a spring is used as the buffer member 526, and as the spring expands and contracts and the shaft portion 522 moves up and down in a z-axis direction, the unevenness of the base material 11 is absorbed. In addition, the buffer member 536 is not limited to the spring and can be applied as long as a member capable of absorbing the unevenness of the base material 11 is provided.

The nut 528 has a function of fixing the shaft portion 522 to the base 540 in a state where the shaft portion 522 is movable up and down in the z-axis direction.

The shaft portion 522 is connected to the hose 532 by the connecting member 530 and penetrates the cavity portion of the shaft portion 522 and the cavity portion of the hose 532. An end part of the hose 532 opposite to an end part connected to the shaft portion 522 is connected to a suction device such as a suction pump (not shown).

As the suction device operates, the air inside the suction pad 521 is suctioned via the hose 532 and the shaft portion 522, and the pressure inside the suction pad 521 drops below the atmospheric pressure. Therefore, as the sensor substrate 12 is pressed against the suction pad 521, the suction pad 521 suctions and supports the sensor substrate 12.

In addition, the area of the suction pad 521, the number of suction members 520 in the suction unit 510, and the arrangement of the suction members 520 are not limited to those of the present embodiment and may be appropriately determined depending on, for example, the weight of the sensor substrate 12 and the conversion layer 14, the area of the second surface 11B of the base material 11, the material of the base material 11, and the like.

Meanwhile, the holding part 512 includes a holding member 550 and a supporting portion 552. The supporting portion 552 has a function of supporting the holding member 550 on the base 540 of the suction unit 510.

As shown in FIG. 9, the holding member 550 holds the circuit board by placing the circuit board (signal processing substrate 300 in FIG. 9) on an upper surface thereof. In the example shown in FIG. 9, the circuit board is placed on the holding member 550 in a state where the flexible cable 112 is extended, in other words, in a state where the flexible cable is not folded or bent. In this way, in the transport jig 500 of the present embodiment, as shown in FIG. 9, the holding member 550 holds the circuit board in the extended state of the flexible cable 112. Therefore, it is possible to suppress a situation where a force is applied to a connected portion between the flexible cable 112 and the terminal 113 and the flexible cable 112 is peeled from the terminal 113. In addition, a holder for fixing the circuit board, a guide for indicating the placement position of the circuit board, and the like may be provided on an upper surface of the holding member 550, that is, a surface on which the circuit board is placed.

Figure 11:
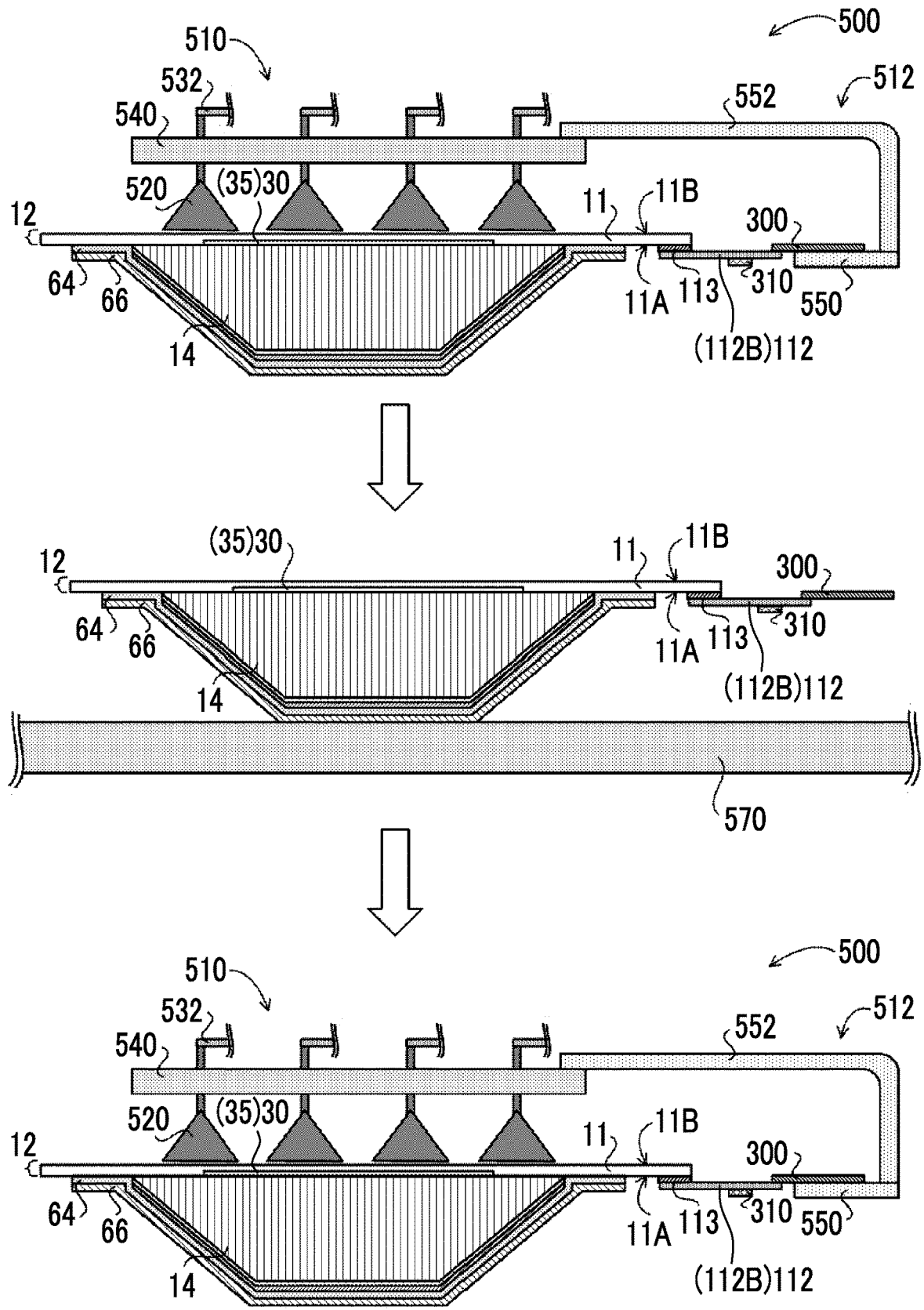
FIG. 11 is a view for explaining the details of the suction transport step.

Specifically, in the suction transport step of the present embodiment, as shown in FIG. 11, the transport jig 500 moves the sensor substrate 12 to which the circuit board is connected from the peeling device onto a transport stage 570. When the sensor substrate 12 is placed on the transport stage 570, the sensor substrate 12 is detached from the transport jig 500. The sensor substrate 12 is transported by the transport stage 570 to a device (in the present embodiment, a reinforcing member installation device described below) in the next step.

When the device in the next step is reached, the sensor substrate 12 is held again by the transport jig 500, and the sensor substrate 12 is moved from the transport stage 570 onto the device in the next step. When the sensor substrate 12 is installed in the device in the next step, the sensor substrate 12 is detached from the transport jig 500.

When the suction transport step of Step S16 is completed in this way, the reinforcing member installation step of Step S18 is then carried out. In the reinforcing member installation step, the reinforcing member 40 is provided on the second surface 11B of the base material 11 of the sensor substrate 12.

Figure 12:
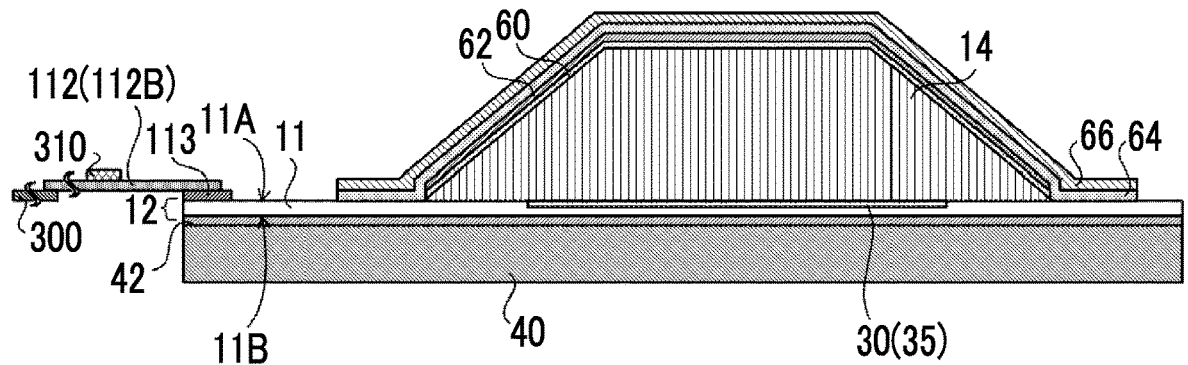
FIG. 12 is a view for explaining an example of a reinforcing member installation step.

Next, as shown in FIG. 12, the reinforcing member 40 is provided on the second surface 11B of the base material 11 with the pressure sensitive adhesive 42. As an example, in the present embodiment, the reinforcing member 40 to which the pressure sensitive adhesive 42 is bonded is prepared, and the prepared reinforcing member 40 is bonded to the second surface 11B of the base material 11 of the sensor substrate 12 fixed on the reinforcing member installation device with the pressure sensitive adhesive 42.

In this way, the radiation detector 10 of the present embodiment is manufactured.

Moreover, by housing the radiation detector 10, the circuit board, and the like in the housing 120, the radiographic imaging apparatus 1 shown in FIG. 4A or FIG. 4B is manufactured. Specifically, additionally, by housing the radiation detector 10 in the housing 120 in a state where the second surface 11B side of the base material 11, specifically, an electromagnetic shield layer knot shown) faces the irradiation surface 120A, the radiographic imaging apparatus 1 shown in FIG. 4A is manufactured.

Additionally, by housing the radiation detector 10 in the housing 120 in a state where the reinforcing member 40 faces the irradiation surface 120A, the radiographic imaging apparatus 1 shown in FIG. 4B is manufactured.

In addition, a method of manufacturing the transport jig 500 and the radiographic imaging apparatus 1 is not limited to the above-described form. For example, transport jigs 500 shown in the following Modification Examples 1 to 3 and a manufacturing method shown in Modification Example 4 may be used.

Modification Example 1

Figure 13:
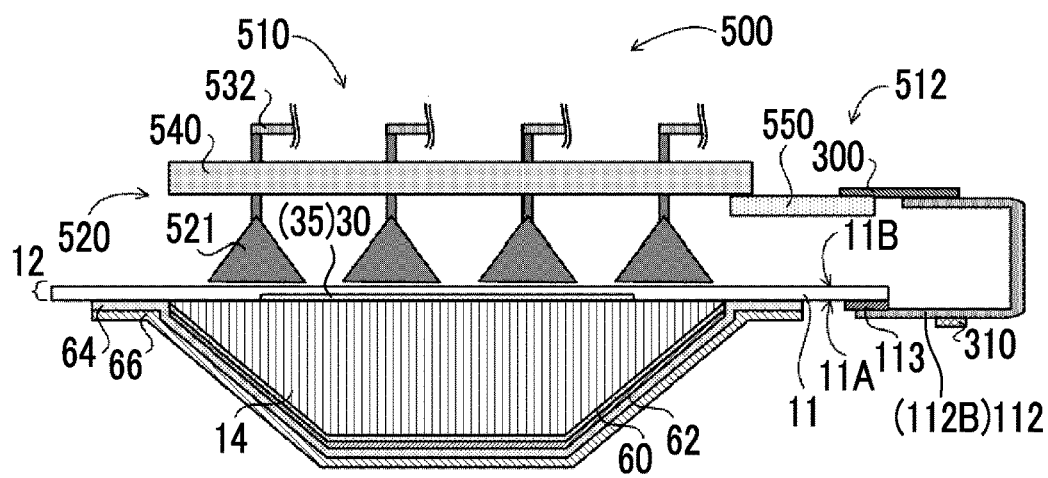
FIG. 13 is a view showing an example of a state where a sensor substrate and a circuit board are held by a transport jig of Modification Example 1.

FIG. 13 shows an example of a state where the sensor substrate 12 and the circuit board (signal processing substrate 300) are held by the transport jig 500 of the present modification example.

As shown in FIG. 13, in the transport jig 500 of the present modification example, the configuration of the holding part 512 is different from that of the above-described holding part 512. In the holding part 512 of the present modification example, the holding member 550 on which the circuit board is placed extends from the base 540 of the suction unit 510. The holding member 550 places the circuit board in a state where the flexible cable 112 is folded. In addition, a holder for fixing the circuit board, a guide for indicating the placement position of the circuit board, and the like may be provided on an upper surface of the holding member 550, that is, a surface on which the circuit board is placed.

In the transport jig 500 of the present modification example, as shown in FIG. 13, the holding member 550 holds the circuit board in a state where the flexible cable 112 is folded. Therefore, even in a case where the flexible cable 112 is long, the space required for transport, specifically, the space for holding the sensor substrate 12 to which the circuit board is connected can be made compact.

Modification Example 2

Figure 14:
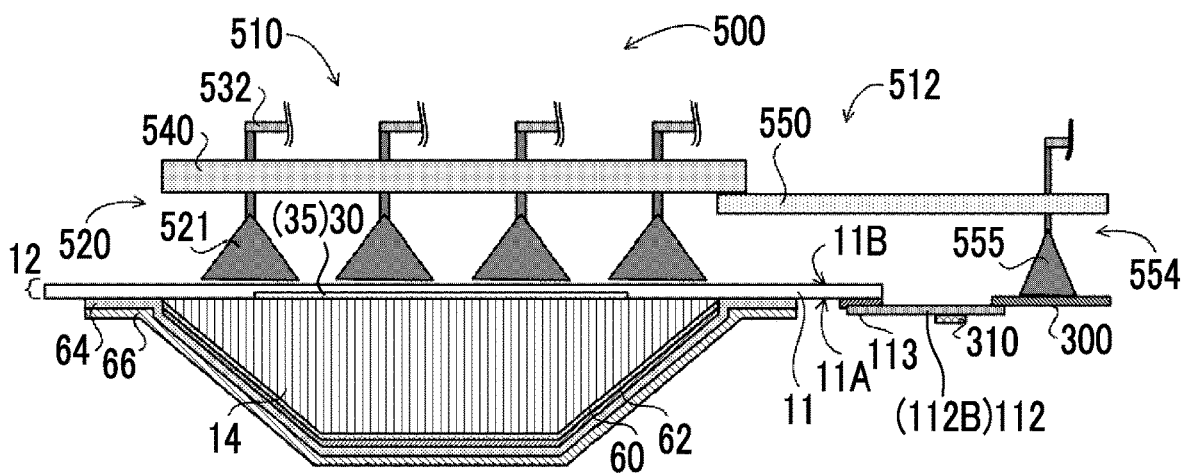
FIG. 14 is a view showing an example of a state where the sensor substrate and the circuit board are held by a transport jig of Modification Example 2.

FIG. 14 shows an example of a state where the sensor substrate 12 and the circuit board (signal processing substrate 300) are held by the transport jig 500 of the present modification example.

As shown in FIG. 14, in the transport jig 500 of the present modification example, the configuration of the holding part 512 is different from that of the above-described holding part 512. In the holding part 512 of the present modification example, the holding member 550 extending from the base 540 of the suction unit 510 has a suction member 554. As an example, the suction member 554 of the present modification example has a suction pad 555 and has the same configuration as the suction member 520 of the suction unit 510. The holding part 512 of the present modification example holds the circuit board by suctioning the circuit board with the suction pad 555 of the suction member 554. In addition, the area of the suction pad 555, the number of suction members 554 in the holding member 550, and the arrangement of the suction members 554 are not limited to those of the present modification example and may be appropriately determined depending on the weight of the entire circuit board, the area of the circuit board, the material the circuit board, and the like.

In the transport jig 500 of the present modification example, as shown in FIG. 14, the holding member 550 holds the circuit board by being suctioned by the suction member 554. Therefore, the circuit board can be held similarly to the sensor substrate 12.

Modification Example 3

Figure 15:
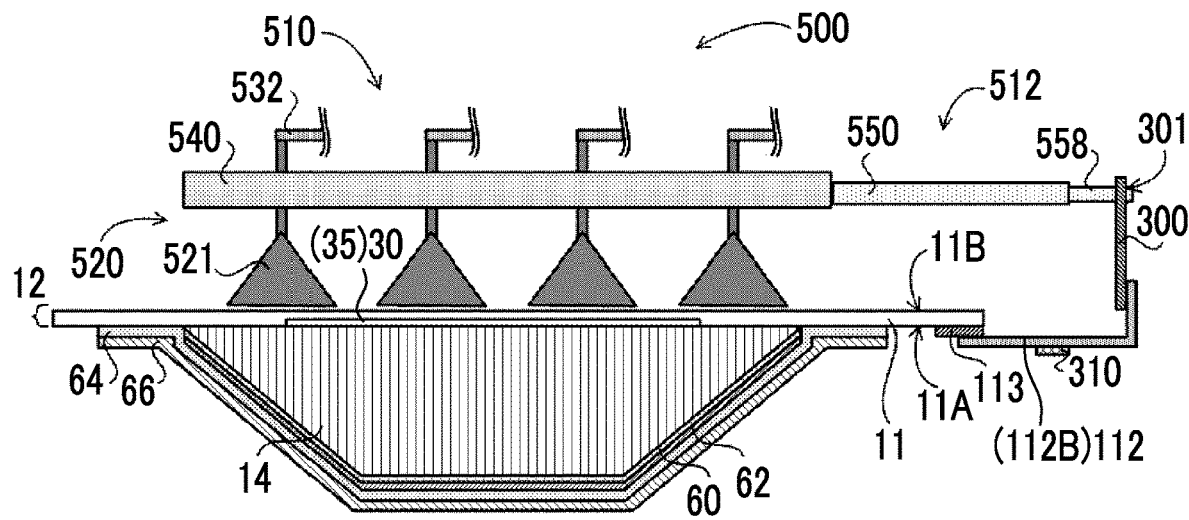
FIG. 15 is a view showing an example of a state where the sensor substrate and the circuit board are held by the transport jig of Modification Example 3.

FIG. 15 shows an example of a state where the sensor substrate 12 and the circuit board (signal processing substrate 300) are held by the transport jig 500 of the present modification example.

As shown in FIG. 15, in the transport jig 500 of the present modification example, the configuration of the holding part 512 is different from that of the above-described holding part 512. In the holding part 512 of the present modification example, a pin 558 is provided on the holding member 550 extending from the base 540 of the suction unit 510. As an example, in the present modification example, the base 540, the holding member 550, and the pin 558 extend linearly. The circuit board of the present modification example is provided with a hole for inserting the pin 558. In the example shown in FIG. 15, the signal processing substrate 300 is provided with a hole 301. The holding part 512 of the present modification example holds the circuit board by fitting a hole (hole 301 in FIG. 15) of the circuit board to the pin 558 of the holding part 512. In the present modification example, as shown in FIG. 15, the circuit board is held by the holding part 512 in a state where the flexible cable 112 is bent. In addition, the number of pins 558 provided in the holding part 512, the size of a diameter or the like of the pin 558, the shape of the pins 558, and the arrangement of the pins 558 in the holding part 512 are not limited to those of the present modification example and may be appropriately determined depending on, for example, the weight of the entire circuit board, the area of the circuit board, the material of the circuit board, and the like. Additionally, a hole provided in the circuit board (hole 301 in FIG. 15) may be provided depending on the arrangement, shape, size, and the like of the pin 558. Additionally, the hole provided in the circuit board (hole 301 in FIG. 15) is not limited to a so-called through-hole that penetrates the circuit board and may be, for example, a hole in the state of a so-called groove having a bottom.

In the transport jig 500 of the present modification example, as shown in FIG. 15, the circuit board is held by fitting the hole of the circuit board to the pin 558 of the holding member 550. Therefore, the holding member 550 can be miniaturized. Additionally, the configuration of the holding member 550 can be simplified. Additionally, as shown in FIG. 15, the circuit board is held in a state where the flexible cable 112 is bent. Therefore, even in a case where the flexible cable 112 is long, the space required for transport, specifically, the space for holding the sensor substrate 12 to which the circuit board is connected can be made compact.

Modification Example 4

Figure 16:
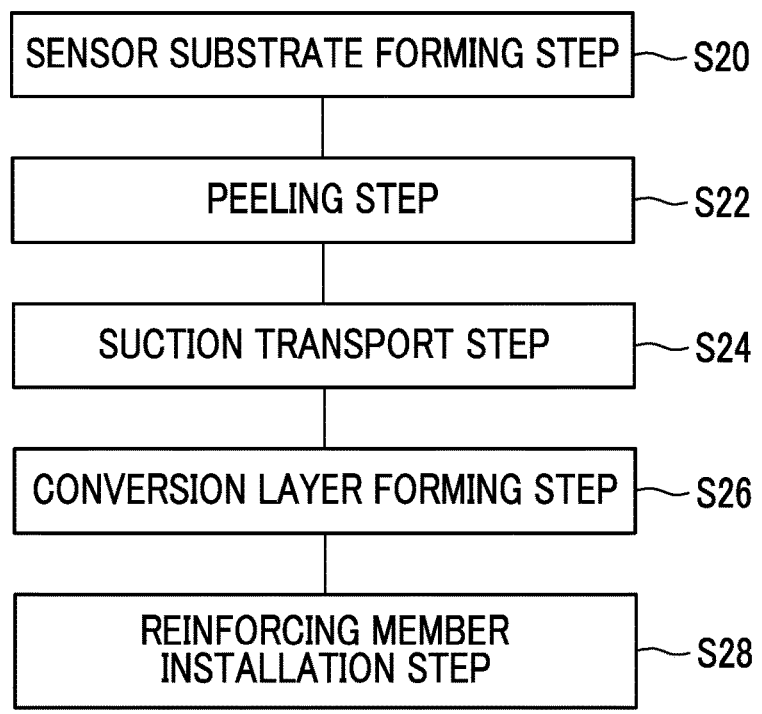
FIG. 16 is a flowchart showing an example of a flow of a manufacturing process of a radiographic imaging apparatus of Modification Example 4.

FIG. 16 shows a flowchart showing an example of a flow of a manufacturing process of the radiation detector 10 of the present modification example. As shown in FIG. 16, the manufacturing process of the present modification example is different from the manufacturing process of the above embodiment (refer to FIG. 5), and the conversion layer forming step S26 is carried out after the suction transport step of S24.

In the sensor substrate forming step of Step S20, the sensor substrate 12 is formed similarly to Step S10 (refer to FIG. 5) of the above form. In addition, the sensor substrate forming step of the present modification example includes a step of providing the terminal 113 on the above-described sensor substrate 12 (refer to FIG. 6) and a step of connecting the circuit board to the terminal 113 (refer to FIG. 7B).

Next, in Step S22, the peeling step is performed similarly to S14 (refer to FIG. 5) of the above form, and the sensor substrate 12 to which the circuit board is connected is peeled from the support body 400.

Next, as described above in Step S24, the suction transport step of transporting the sensor substrate 12 to which the circuit board is connected by the transport jig 500 is performed. In this case, the sensor substrate 12 and the circuit board in a state where the conversion layer 14 is not provided are placed on the transport stage 570 (refer to FIG. 11), and the sensor substrate 12 is transported to a device for providing the conversion layer 14.

Next, in Step S26, the conversion layer forming step of providing the conversion layer 14 on the sensor substrate 12 is carried out similarly to S12 (refer to FIG. 5) of the above form. Moreover, in the next Step S28, the reinforcing member installation step of providing the reinforcing member 40 on the second surface 11B of the base material 11 of the sensor substrate 12 is carried out similarly to S18 (refer to FIG. 5) of the above form.

In this way, also in the method of manufacturing the radiographic imaging apparatus 1 of the present modification example, the sensor substrate 12 and the circuit board are transported in a state where the sensor substrate 12 after peeling from the support body 400 is suctioned by the suction unit 510 of the transport jig 500 and the circuit board is held by the holding part 512 of the transport jig 500.

As described above, the method of manufacturing the radiographic imaging apparatus 1 of the above-described embodiment comprises the step of providing the flexible base material 11 on the support body 400 and forming the sensor substrate 12 in which the plurality of pixels 30 that accumulate the electric charges generated in response to the light converted from the radiation are provided in the pixel region 35 of the first surface 11A of the base material 11. Additionally, the method of manufacturing the radiographic imaging apparatus 1 comprises the step of providing the terminal 113 for electrically connecting the flexible cable 112 on the first surface 11A of the base material 11. Additionally, the method of manufacturing the radiographic imaging apparatus 1 comprises the step of electrically connecting the circuit board for reading the electric charges from the pixels 30 or driving the pixels 30 to the terminal 113 via the flexible cable 112. Additionally, the method of manufacturing the radiographic imaging apparatus 1 comprises the step of peeling the sensor substrate 12 in which the terminal 113 is electrically connected to the circuit board via the flexible cable 112, from the support body 400. Moreover, the method of manufacturing the radiographic imaging apparatus 1 comprises the step of using the transport jig 500 including the suction unit 510 having the plurality of suction members 520 and the holding part 512 having the holding member 550, to suction and support the first surface 11A of the base material 11 or the second surface 11B opposite to the first surface 11A with the plurality of suction members 520, and transporting the sensor substrate 12 peeled from the support body 400 in a state where the circuit board is held by the holding member 550.

In this way, according to the method of manufacturing the radiographic imaging apparatus 1 of each of the above forms, the sensor substrate 12 after peeling from the support body 400 is transported by the transport jig 500 including the suction unit 510 having the plurality of suction members 520 and the holding part 512 having the holding member 550. Therefore, according to the method of manufacturing the radiographic imaging apparatus 1 of each of the above forms, the sensor substrate 12 formed of the flexible base material 11 and the circuit board can be transported in a stable state.

In addition, the configurations of the radiographic imaging apparatus 1 and the radiation detector 10 and the manufacturing method thereof are not limited to those of the above respective forms. For example, in each of the above forms, a state where the holding part 512 of the transport jig 500 holds the signal processing substrate 300 as an example of the circuit board is shown, but the circuit board held by the holding part 512 is not limited to the signal processing substrate 300. The holding part 512 of the transport jig 500 may be in the form of holding other circuit boards connected to the terminal 113 of the sensor substrate 12, or may be in the form of holding all the circuit boards. And, for example, the circuit board may be held by the holding part 512 having a different form depending on the type of the circuit board. For example, the signal processing substrate 300 may be in the form of being held by the holding part 512 shown in Modification Example 3, and the driving substrate 200 may be in the form of being held by the holding part 512 shown in Modification Example 2. Additionally, for example, the transport jig 500 used may be different before and after the sensor substrate 12 is placed on the transport stage 570 shown in FIG. 11. In other words, the holding part 512 of the transport jig 500 that holds the circuit board may be different before and after the sensor substrate 12 is placed on the transport stage 570.

Additionally, for example, in each of the above embodiments, an embodiment in which the conversion layer 14 is CsI has been described, but the conversion layer 14 is not limited to CsI. For example, the conversion layer 14 may be one formed of GOS ($Gd_2O_2S$: Tb) or the like. In this case, for example, the conversion layer 14 can be formed on the sensor substrate 12 by preparing one in which a sheet having GOS dispersed in a binder such as resin is bonded to a support body formed of white PET or the like with a pressure sensitive adhesive layer or the like, and bonding a side of the GOS on which the support body is not bonded, and the pixel 30 of the sensor substrate 12 to each other with the pressure sensitive adhesive sheet or the like. In addition, the conversion efficiency from radiation to visible light is higher in a case where CsI is used for the conversion layer 14 than in a case where GOS is used.

Additionally, for example, as shown in FIG. 1, an aspect in which the pixels 30 are two-dimensionally arranged in a matrix has been described. However, the invention is not limited, and the pixels 30 may be one-dimensionally arranged or may be arranged in a honeycomb arrangement. Additionally, the shape of the pixels is also not limited and may be a rectangular shape or may be a polygonal shape, such as a hexagonal shape. Moreover, the shape of the pixel region 35 is also not limited.

In addition, the configurations, manufacturing methods, and the like of the radiographic imaging apparatuses 1, the radiation detectors 10, and the like in the respective forms are merely examples, and can be changed depending on situations without departing from the scope of the present invention.

What is claimed is:

1. A method of manufacturing a radiographic imaging apparatus, the method comprising:
   providing a base material on a support body, the base material having flexibility and is formed of a resin sheet;
   forming a plurality of pixels that accumulate electric charges generated in response to light converted from radiation in a pixel region of a first surface of the base material;
   providing a terminal portion for electrically connecting a cable on the first surface of the base material;
   electrically connecting a circuit board for reading the electric charges from the pixels or driving the pixels to the terminal portion via the cable;
   peeling the base material in which the terminal portion is electrically connected to the circuit board via the cable from the support body; and
   using a transport jig including a suction unit having a plurality of suction members and a holding part having a holding member, to suction and support the first surface of the base material or a second surface opposite to the first surface with the plurality of suction members, and transporting the base material peeled from the support body in a state where the circuit board is held by the holding member by placing the circuit board on the holding member in a state where the cable is folded or in a state where the cable is extended.

2. The method of manufacturing a radiographic imaging apparatus according to claim 1, further comprising:
   forming a conversion layer that converts the radiation into light, on the first surface of the base material,
   wherein in transporting the base material with the transport jig, the base material provided with the conversion layer is transported by the transport jig.

3. The method of manufacturing a radiographic imaging apparatus according to claim 1, further comprising:
   forming a conversion layer that converts the radiation into light, on the first surface of the base material after the base material is transported by the transport jig.

4. The method of manufacturing a radiographic imaging apparatus according to claim 1, further comprising:
   providing a reinforcing member for reinforcing a strength of the base material on the second surface of the base material.

5. The method of manufacturing a radiographic imaging apparatus according to claim 1,
   wherein the circuit board is provided with a hole,
   the holding member of the transport jig is provided with a pin, and
   the transport jig holds the circuit board by inserting the pin into the hole of the circuit board.

6. The method of manufacturing a radiographic imaging apparatus according to claim 1,
   wherein the holding member of the transport jig holds the circuit board by suction.

7. The method of manufacturing a radiographic imaging apparatus according to claim 1,
   wherein the transport jig supports an entire surface of the second surface of the base material with the plurality of suction members.

8. The method of manufacturing a radiographic imaging apparatus according to claim 1,
   wherein each of the plurality of suction members of the transport jig is provided with a buffer member that absorbs unevenness of the base material.

9. A transport jig for transporting a base material in which a pixel region of a first surface of the base material is provided with a plurality of pixels for accumulating electric charges generated in response to light converted from radiation and which is provided with a terminal portion to which a circuit board for reading the electric charges from the pixels or for driving the pixels is electrically connected via a cable, the base material having flexibility and is formed of a resin sheet, the transport jig comprising:
   a suction unit having a plurality of suction members for suctioning the first surface of the base material or a second surface opposite to the first surface; and
   a holding part having a holding member that holds the circuit board by placing the circuit board on the holding member in a state where the cable is folded or in a state where the cable is extended.

10. The transport jig according to claim 9,
wherein each of the plurality of suction members is provided with a buffer member that absorbs unevenness of the base material.

\* \* \* \* \*